(12) United States Patent
Lind

(10) Patent No.: US 9,088,085 B2
(45) Date of Patent: Jul. 21, 2015

(54) HIGH TEMPERATURE ELECTRODE CONNECTIONS

(71) Applicant: Novellus Systems, Inc., Fremont, CA (US)

(72) Inventor: Gary Lind, Nevada City, CA (US)

(73) Assignee: Novellus Systems, Inc., Fremont, CA (US)

( * ) Notice: Subject to any disclaimer, the term of this patent is extended or adjusted under 35 U.S.C. 154(b) by 95 days.

(21) Appl. No.: 13/667,338

(22) Filed: Nov. 2, 2012

(65) Prior Publication Data

US 2014/0087587 A1    Mar. 27, 2014

Related U.S. Application Data

(60) Provisional application No. 61/704,423, filed on Sep. 21, 2012.

(51) Int. Cl.
*H01R 13/434* (2006.01)
*H01R 43/26* (2006.01)
(Continued)

(52) U.S. Cl.
CPC .......... *H01R 13/434* (2013.01); *C23C 16/4583* (2013.01); *C23C 16/509* (2013.01);
(Continued)

(58) Field of Classification Search
CPC ............... C23C 16/4586; C23C 16/509; G01J 2005/065; H01J 37/32431; H01J 37/32532–37/32614; H01J 37/32541; H01J 37/3255; H01J 37/32559; H01J 37/32658; H01J 37/32577; H01J 37/32605; H01J 21/67178; H01L 21/683; H01L 21/6831; H01L 21/6833; H01L 21/68785; H01L 21/68792; H01L 2924/0002; H01R 13/2407; H01R 13/434; H01R 35/04; H01R 43/26; Y10T 29/49117
USPC ............. 118/715, 725, 728, 729, 730, 723 R, 118/50.1; 156/345.1, 345.51, 345.52, 156/345.47, 345.53, 345.54, 345.55; 219/541, 544; 269/309
See application file for complete search history.

(56) References Cited

U.S. PATENT DOCUMENTS 3,172,721 A * 3/1965 Kelly ............................. 439/589
4,209,357 A    6/1980 Gorin et al.
(Continued)

FOREIGN PATENT DOCUMENTS

JP    61-265820 A    11/1986
JP    H02-35438 U    3/1990
(Continued)

OTHER PUBLICATIONS

Childs, Peter R.N. (2004). Mechanical Design (2nd Edition). Elsevier. Chapter 11: Springs. pp. 225-249.*
(Continued)

*Primary Examiner* — Jeffrie R Lund
*Assistant Examiner* — Stanislav Antolin
(74) *Attorney, Agent, or Firm* — Weaver Austin Villeneuve & Sampson LLP

(57) ABSTRACT

Embodiments include a high temperature electrode connection assembly for a wafer-processing pedestal. The high temperature electrode connection assembly includes an electrode rod having a cup that mounts to a stud embedded in the pedestal and a plate adapter portion. The assembly also includes a floating plate having an outer surface and an aperture for receiving the electrode rod. The floating plate contacts an inner surface of the pedestal to resist lateral movement of the electrode rods. The assembly also includes an anti-rotation retainer ring that frictionally engages the electrode rod and an anti-rotation post extending from the outer surface of the floating plate. The anti-rotation post limits rotation of the electrode rod with respect to the floating plate.

23 Claims, 17 Drawing Sheets

(51) Int. Cl.
*H01R 13/24* (2006.01)
*H01R 13/35* (2006.01)
*H01L 21/687* (2006.01)
*H01J 37/32* (2006.01)
*C23C 16/458* (2006.01)
*C23C 16/50* (2006.01)
*C23C 16/509* (2006.01)
*H01R 35/04* (2006.01)

(52) U.S. Cl.
CPC ..... *H01J 37/32532* (2013.01); *H01J 37/32577* (2013.01); *H01J 37/32605* (2013.01); *H01L 21/68792* (2013.01); *H01R 35/04* (2013.01); *H01R 43/26* (2013.01); *H01R 13/2407* (2013.01); *Y10T 29/49117* (2015.01)

(56) References Cited

U.S. PATENT DOCUMENTS

| | | | |
|---|---|---|---|
| 4,512,841 A | | 4/1985 | Cunningham, Jr. et al. |
| 5,462,603 A * | | 10/1995 | Murakami ............ 118/719 |
| 5,669,316 A * | | 9/1997 | Faz et al. ............ 108/142 |
| 5,670,066 A | | 9/1997 | Barnes et al. |
| 5,778,969 A * | | 7/1998 | Kyung et al. ........... 165/80.1 |
| 6,041,734 A | | 3/2000 | Raoux et al. |
| 6,042,686 A | | 3/2000 | Dible et al. |
| 6,066,836 A * | | 5/2000 | Chen et al. ............. 219/390 |
| 6,118,100 A * | | 9/2000 | Mailho et al. ........... 219/390 |
| 6,232,236 B1 | | 5/2001 | Shan et al. |
| 6,367,413 B1 | | 4/2002 | Sill et al. |
| 6,368,451 B1 * | | 4/2002 | Goulette et al. ........... 174/152 R |
| 6,376,808 B2 * | | 4/2002 | Tachikawa et al. ........ 219/444.1 |
| 6,465,051 B1 | | 10/2002 | Sahin et al. |
| 6,465,763 B1 * | | 10/2002 | Ito et al. ............. 219/444.1 |
| 6,478,924 B1 | | 11/2002 | Shamouilian et al. |
| 6,626,998 B1 * | | 9/2003 | Dunham ............. 118/723 R |
| 6,642,661 B2 | | 11/2003 | Strang |
| 6,761,772 B2 * | | 7/2004 | Giacri et al. ............ 118/730 |
| 7,098,428 B1 * | | 8/2006 | Elliot et al. ............ 219/444.1 |
| 7,432,467 B2 | | 10/2008 | Yamazawa |
| 7,540,257 B2 | | 6/2009 | Kishimoto et al. |
| 7,767,054 B2 | | 8/2010 | Kobayashi et al. |
| 7,981,777 B1 | | 7/2011 | Subramonium et al. |
| 7,981,810 B1 | | 7/2011 | Subramonium et al. |
| 8,018,163 B2 | | 9/2011 | Wi |
| 2001/0009139 A1 | | 7/2001 | Shan et al. |
| 2002/0094591 A1 | | 7/2002 | Sill et al. |
| 2002/0108714 A1 * | | 8/2002 | Doering et al. ........... 156/345.51 |
| 2003/0052085 A1 | | 3/2003 | Parsons |
| 2003/0079983 A1 | | 5/2003 | Long et al. |
| 2003/0089600 A1 * | | 5/2003 | Natsuhara et al. ....... 204/297.01 |
| 2003/0106647 A1 | | 6/2003 | Koshiishi et al. |
| 2004/0211764 A1 * | | 10/2004 | Doering et al. ........... 219/390 |
| 2004/0244688 A1 | | 12/2004 | Himori et al. |
| 2005/0098106 A1 | | 5/2005 | Fink et al. |
| 2006/0037857 A1 * | | 2/2006 | Natsuhara et al. ....... 204/297.06 |
| 2006/0199131 A1 * | | 9/2006 | Kawasaki et al. ............ 432/120 |
| 2006/0219363 A1 | | 10/2006 | Matsumoto et al. |
| 2007/0044718 A1 * | | 3/2007 | Natsuhara et al. ............ 118/725 |
| 2007/0113786 A1 * | | 5/2007 | Ho ............ 118/723 E |
| 2007/0235412 A1 | | 10/2007 | Fischer |
| 2008/0017111 A1 * | | 1/2008 | Ishisaka et al. ............ 118/723 E |
| 2008/0017318 A1 | | 1/2008 | Kobayashi et al. |
| 2009/0159587 A1 * | | 6/2009 | Shimanuki et al. ........ 219/443.1 |
| 2009/0199766 A1 * | | 8/2009 | Tappan ............ 118/723.1 |
| 2009/0206058 A1 | | 8/2009 | Iwata et al. |
| 2010/0015357 A1 | | 1/2010 | Hanawa et al. |
| 2010/0080933 A1 | | 4/2010 | Kudela et al. |
| 2010/0323313 A1 * | | 12/2010 | Toriya et al. ............ 432/200 |
| 2011/0031217 A1 | | 2/2011 | Himori |
| 2011/0253672 A1 | | 10/2011 | Kamibayashi et al. |
| 2012/0103970 A1 * | | 5/2012 | Lubomirsky et al. ...... 219/460.1 |
| 2012/0164834 A1 * | | 6/2012 | Jennings et al. ............ 438/694 |

FOREIGN PATENT DOCUMENTS

| | | |
|---|---|---|
| JP | 09-176860 | 7/1997 |
| JP | 10326772 | 12/1998 |
| JP | 2002-009043 | 1/2002 |
| JP | 2002-231798 | 8/2002 |
| JP | 4436575 | 3/2010 |
| JP | 2012/089694 | 10/2012 |
| WO | WO 2005/048367 | 5/2005 |
| WO | WO 2012/087737 | 6/2012 |

OTHER PUBLICATIONS

Oberg, Erik Jones, Franklin D. Horton, Holbrook L. Ryffel, Henry H. (2004). Machinery's Handbook (27th Edition) & Guide to Machinery's Handbook. Industrial Press. Retaining Rings. pp. 1684-1711.*

U.S. Appl. No. 11/849,208, filed Aug. 31, 2007, entitled "Methods and Apparatus for Plasma-Based Deposition."

US Office Action, dated Sep. 3, 2010, issued in U.S. Appl. No. 11/849,208.

US Final Office Action, dated Apr. 12, 2011, issued in U.S. Appl. No. 11/849,208.

US Office Action, dated Sep. 14, 2012, issued in U.S. Appl. No. 11/849,208.

U.S. Final Office Action dated Apr. 24, 2013, issued in U.S. Appl. No. 11/849,208.

US Office Action, dated Mar. 27, 2013, issued in U.S. Appl. No. 12/976,391.

US Office Action, dated Oct. 18, 2013, issued in U.S. Appl. No. 12/976,391.

PCT International Invitation to Pay Additional Fees and Partial Search Report dated Jul. 24, 2012, issued in Application No. PCT/US2011/065099.

PCT International Search Report and Written Opinion dated Sep. 19, 2012, issued in Application No. PCT/US2011/065099.

PCT International Preliminary Report on Patentability and Written Opinion dated Jul. 4, 2013, issued in Application No. PCT/US2011/065099.

"Summary of Pedestal Assembly Sold Prior to Sep. 21, 2011," 8 pages including a summary and drawings, Lam Research, Inc., (Jun. 2012 Novellus Systems, Inc. became a wholly owned subsidiary of Lam Research Corporation) San Jose, California.

* cited by examiner

FIG. 1D     FIG. 1E     FIG. 1F

HIGH TEMPERATURE ELECTRODE CONNECTIONS

CROSS REFERENCE TO RELATED APPLICATIONS

This is a non-provisional application that claims benefit of U.S. Provisional Patent Application Ser. No. 61/704,423 filed Sep. 21, 2012, which is hereby incorporated by reference in its entirety and for all purposes.

BACKGROUND

In semiconductor fabrication, a silicon wafer may be located on a pedestal as materials are deposited on or removed from the wafer and during other manufacturing processes. A pedestal can refer to an apparatus capable of receiving and supporting a silicon wafer or other suitable element and/or capable of maintaining certain process conditions. The pedestal may include devices for maintaining process conditions such as, for example, a resistance heating element, a radio frequency (RF) antenna, and a thermocouple, other such equipment, or subcombinations thereof.

External electrodes may be attached to studs embedded in the pedestal that are electrically connected to the devices in the pedestal and power those devices. Since these electrodes are in contact with the pedestal, they can experience high thermal cycling during the fabrication processes. Also, the electrodes can see high bending and shear stresses at the attachment of the electrodes to the studs during routine maintenance and handling.

SUMMARY

Various embodiments relate to a high temperature electrode assembly for electrically connecting one or more devices in a pedestal to power sources outside the pedestal. In some implementations, the assembly may include single-piece electrode rods, a floating plate with anti-rotation posts, and anti-rotation retainer rings. A threaded cup at the end of each electrode rod connects to a stud providing electrical connectivity to the devices in the pedestal. The center portion of each electrode rod has a relatively small cross-sectional area to reduce thermal loads conducted from the pedestal to outer components, such as seals. The electrode rods fit into apertures in the floating plate. Each of the electrode rods has a shoulder for supporting the plate. The floating plate fits within the pedestal stem with enough clearance to allow movement along the axes of the electrode rods during thermal expansion/contraction while preventing lateral movement of the electrode rods. An anti-rotation ring is clamped to the outside of each electrode rod. The anti-rotation ring is in contact with the anti-rotation post affixed to the floating plate in order to prevent loosening of the electrode rod.

In some embodiments, a high temperature electrode connection assembly for a wafer-processing pedestal includes an electrode rod and a floating plate with an outer surface and an aperture for receiving the electrode rod. The electrode rod has a cup for mounting to a stud embedded in a pedestal and a plate adapter portion. The high temperature electrode connection assembly also includes an anti-rotation ring and an anti-rotation post extending from the outer surface of the floating plate. The floating plate contacts an inner surface of the pedestal to resist lateral movement of the electrode rod. In some cases, there is clearance between the floating plate and the inner surface of the pedestal for relative movement of the floating plate and the pedestal. The anti-rotation retainer ring frictionally engages the electrode rod and the anti-rotation post limits rotation of the electrode rod with respect to the floating plate. In some cases, the plate adapter portion has a circumferential groove and the anti-rotation retainer ring engages the electrode rod at the groove.

In an aspect of embodiments, a Belleville washer is installed between a shoulder of the stud embedded in the pedestal and the cup of the electrode rod. In one case, the Belleville washer is at least partially flatted to preload the washer.

In another aspect of embodiments, the floating plate may have one or more index marks for locating the anti-rotation ring. In one implementation, the first index mark may indicate the location of the anti-rotation ring where the washer has been preloaded. In another implementation, the first index mark may indicate a predefined number of degrees of release of the washer from preload.

Another aspect of embodiments provides a high temperature electrode rod having a cup for mounting to a stud embedded in the wafer-processing pedestal. The electrode rod also has a plate adapter portion, a stem between the cup and the plate adapter portion, and a circumferential groove in the plate adapter portion. The circumferential groove can frictionally engage an anti-rotation retainer ring configured to limit rotation of the electrode rod with respect to the floating plate when in contact with the anti-rotation post. The electrode rod also having a shoulder in the plate adapter portion for limiting axial movement of the floating plate. In some cases, the electrode rod is made of stainless steel with Palladium plating. In other cases, the electrode rod is made of stainless steel with Rhodium plating. The electrode rod may have a wrenching feature for rotating the electrode rod outside the floating plate. The ratio of the outer diameters of the cup to the stem may be between 2:1 and 5:1 in some cases.

In another aspect, the electrode rod may have a stem between the cup and the plate adapter portion. In some cases, the ratio of the outer diameters of the cup to the stem is between 2:1 and 5:1. The plate adapter portion can also have a shoulder. The floating plate may be located in a gap between the shoulder of the plate adapter portion and the anti-rotation ring.

In another aspect, embodiments include a method of installing a high temperature electrode connection assembly having a high temperature electrode rod having a cup and a plate adapter portion with a circumferential groove. In this method, the cup of the electrode rod is mounted to a stud in a wafer-processing pedestal. The floating plate is positioned to locate the electrode rod through an aperture in the floating plate. The electrode rod is tightened to preload a washer between the cup and a shoulder of the stud in the pedestal. The anti-rotational ring frictionally engages in the circumferential groove around the electrode rod. The washer is partially released from preload by loosening the electrode rod by a predefined number of degrees. The anti-rotational ring is placed in contact with or in close proximity to an anti-rotation post affixed to the floating plate. In one aspect, the method includes orienting a feature of the anti-rotation retainer ring to a first index mark on the floating plate. In another aspect, the method includes rotating the electrode rod such that the anti-rotation retainer ring is in contact with or in close proximity to the anti-rotation post.

These and other aspects are described further below with reference to the drawings.

BRIEF DESCRIPTION OF THE DRAWINGS

FIGS. 1C, 1D, 1E, 1F, 1G, and 1H are drawings depicting other views of components of the pedestal assembly of FIG. 1A.

DETAILED DESCRIPTION

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific details, it will be understood that it is not intended to limit the disclosed embodiments to only those details.

Pedestal Assembly

Figure 1A:
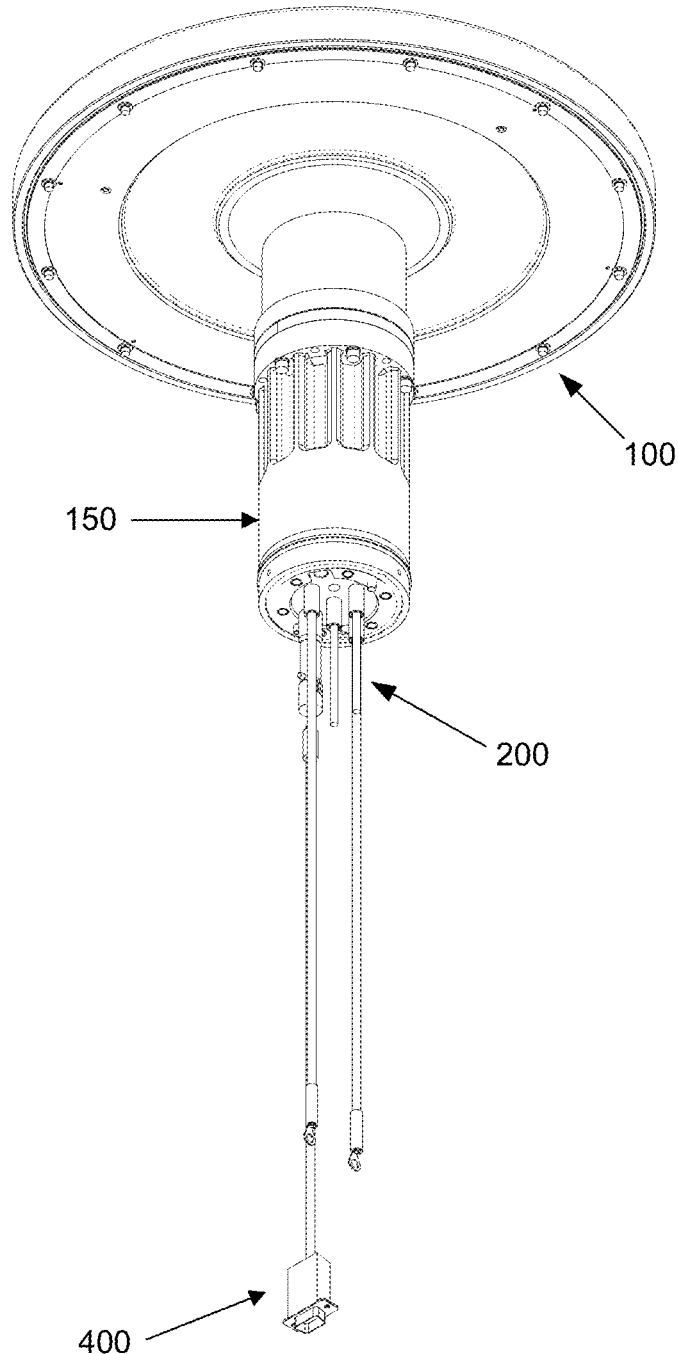
FIG. 1A is a drawing depicting a perspective view of components of a pedestal assembly, according to disclosed embodiments.
Figure 1B:
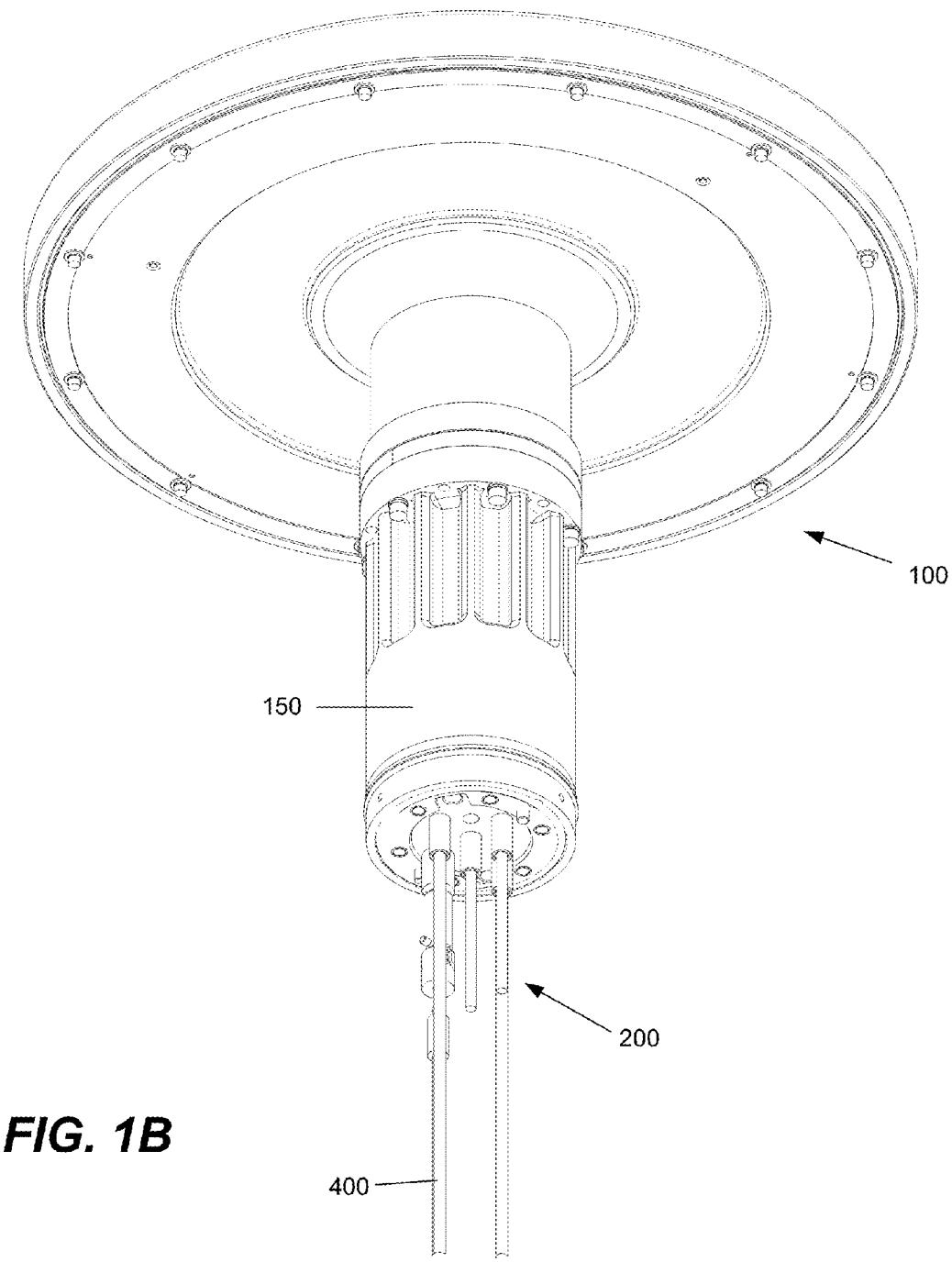
FIG. 1B is a drawing depicting a detailed view of a portion of the drawing in FIG. 1A.
Figure 1C:
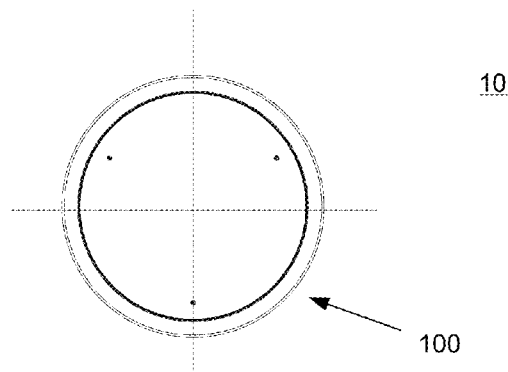
Figure 1C:
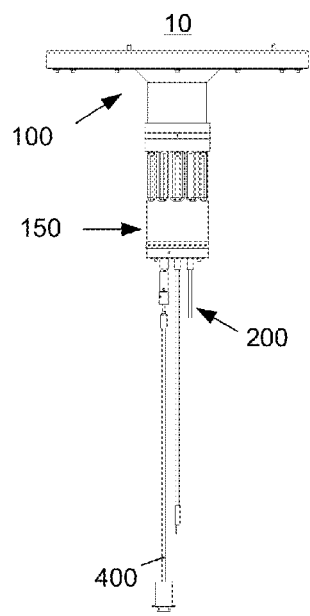
Figure 1C:
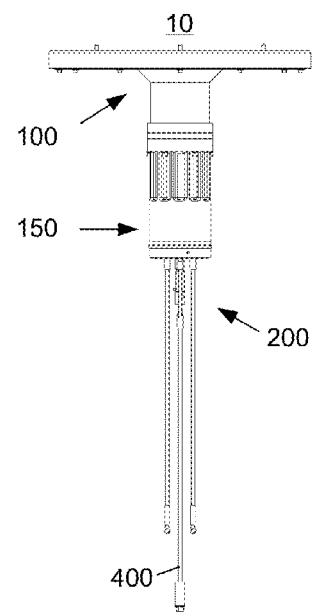
Figure 1C:
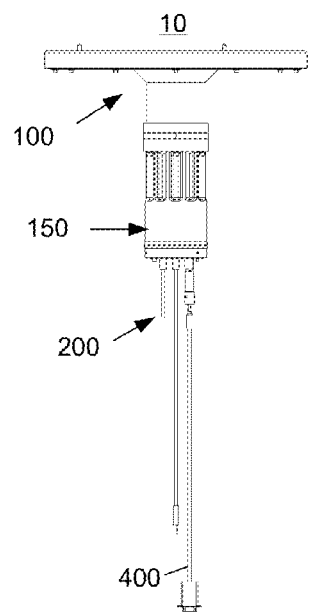
Figure 1G:
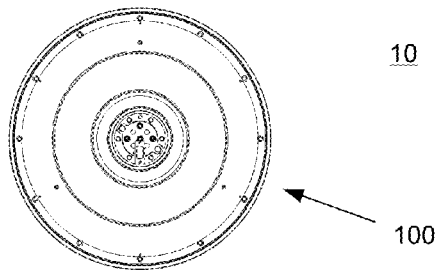
Figure 1H:
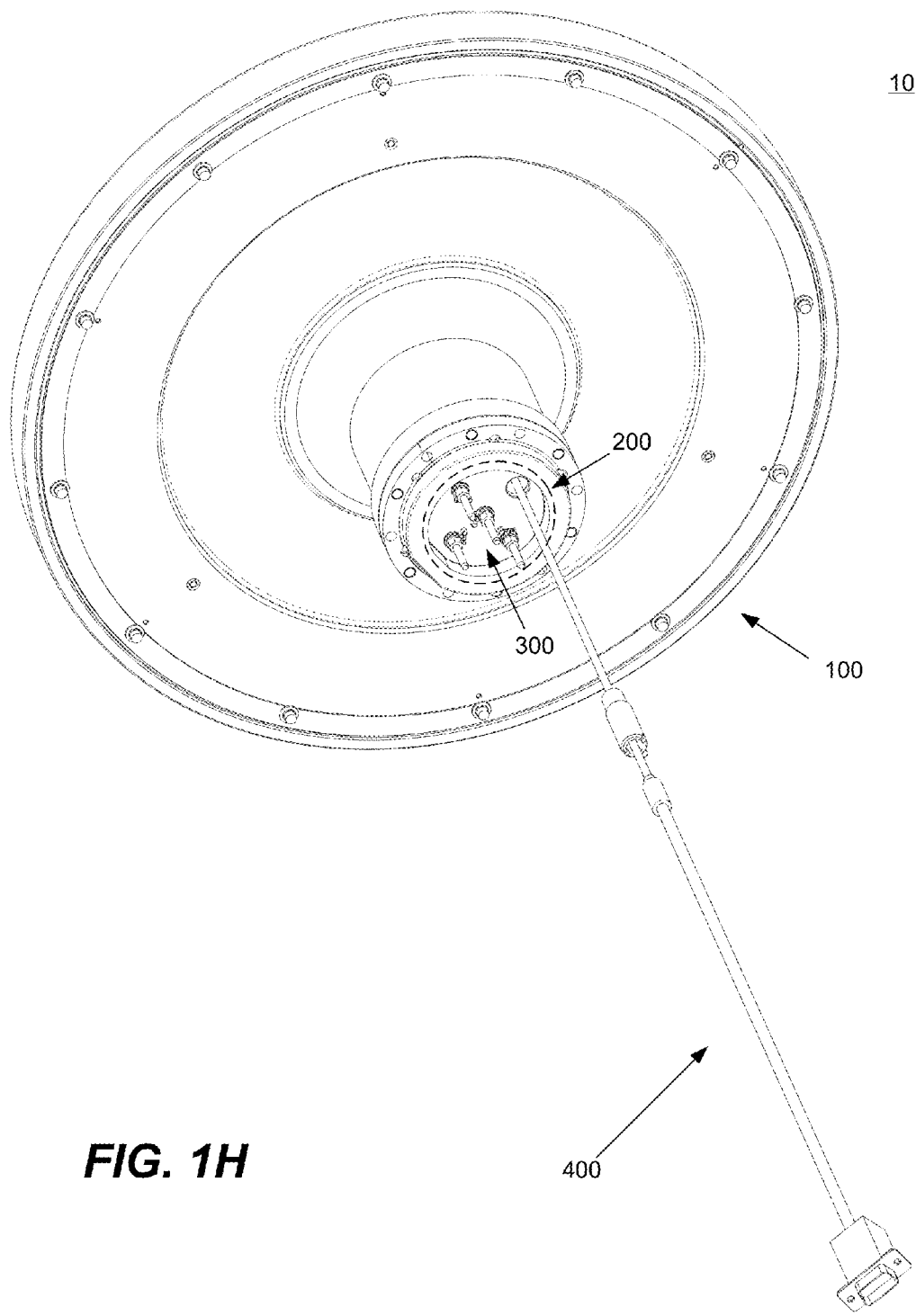
Figure 1I:
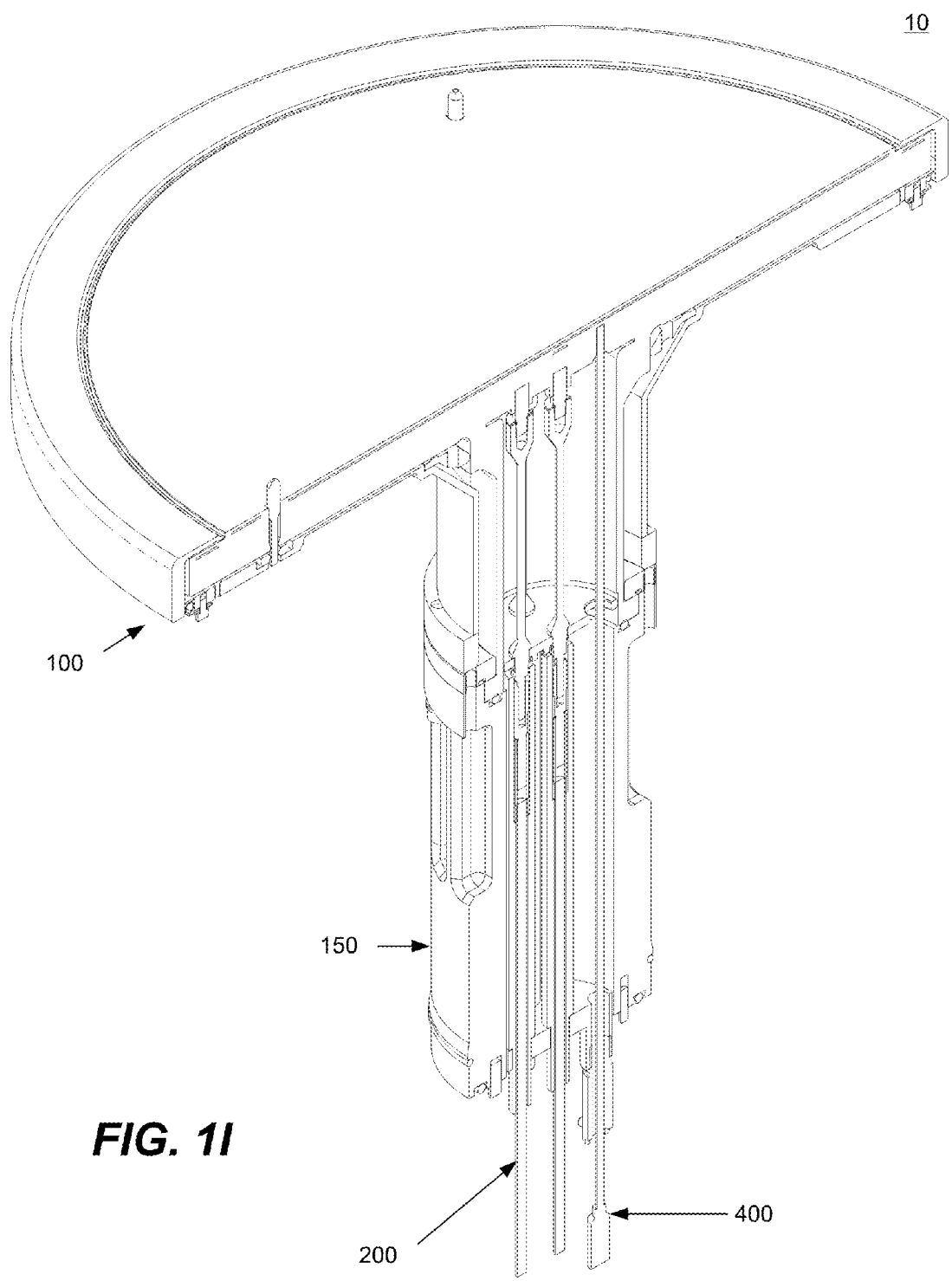
FIGS. 1I and 1J are isometric cutaway drawings of the pedestal assembly of FIG. 1A.
Figure 1J:
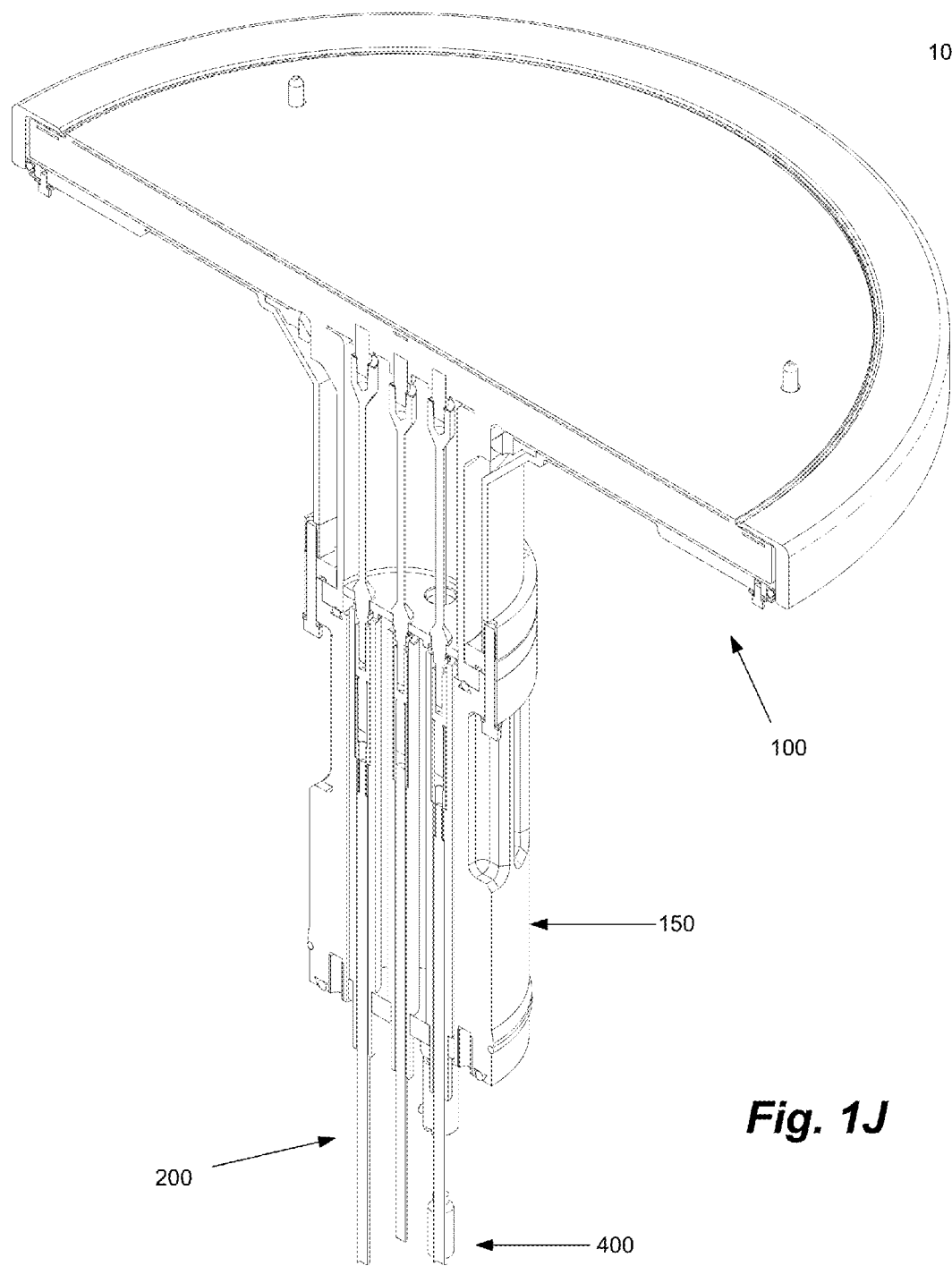
Figure 1K:
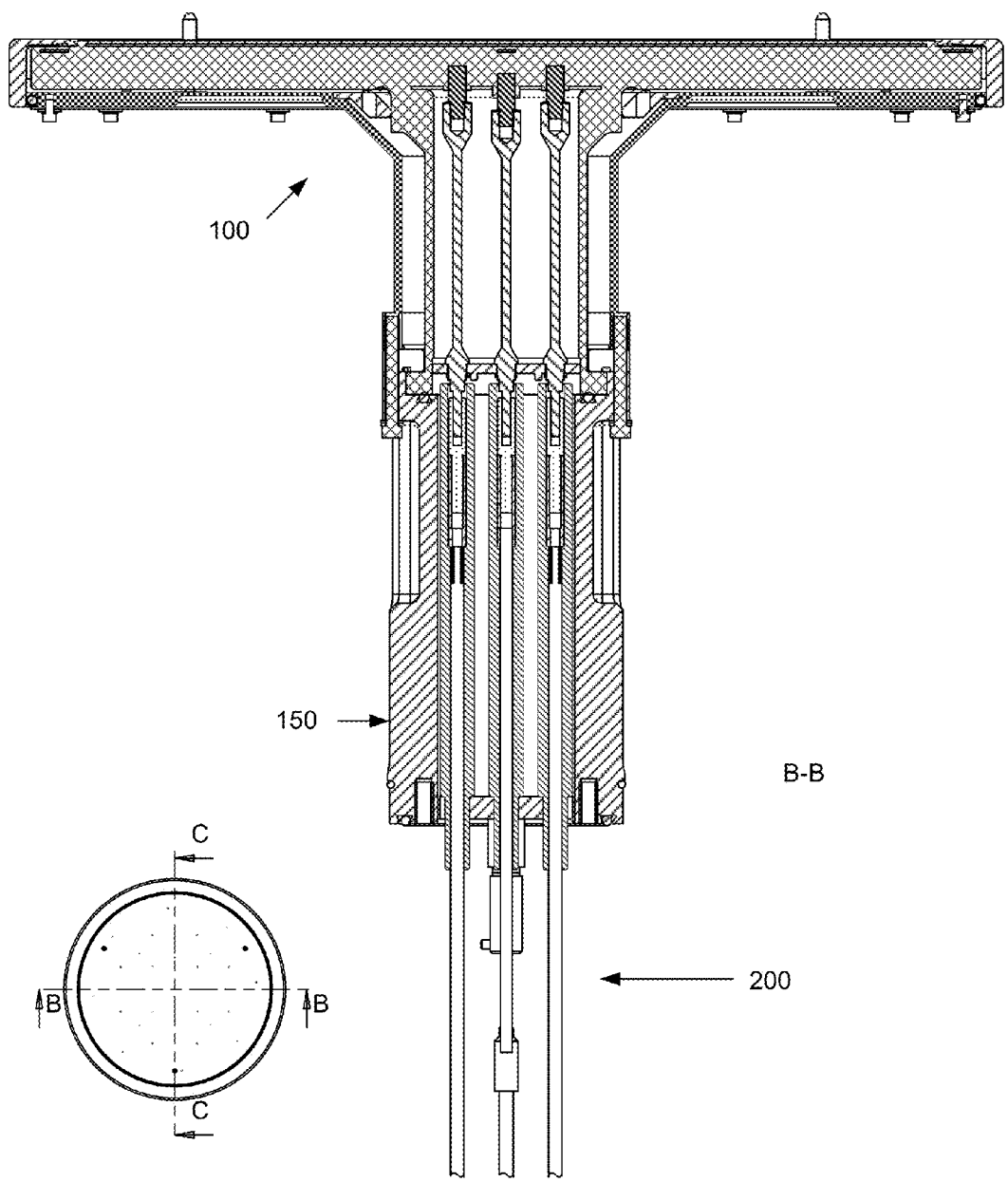
FIGS. 1K and 1L are cross-sectional drawings of the pedestal assembly of FIG. 1A.
Figure 1L:
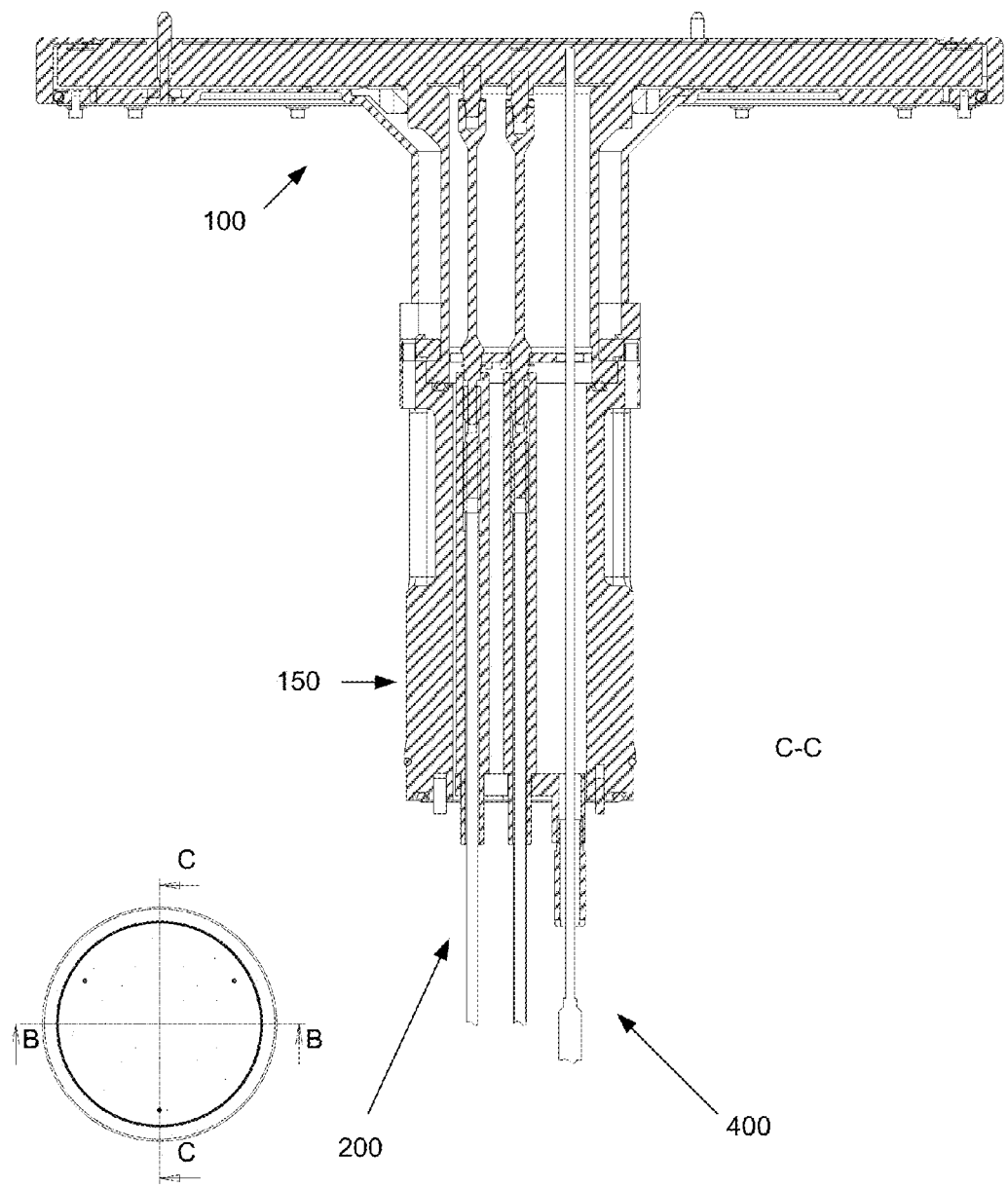

FIG. 1A is a drawing depicting a perspective view of components of a pedestal assembly 10, according to disclosed embodiments. FIG. 1B is a drawing depicting an expanded view of a portion of the drawing in FIG. 1A. FIGS. 1C, 1D, 1E, 1F, 1G, and 1H are drawings depicting other views of components of the pedestal assembly 10 of FIG. 1A. FIGS. 1I and 1J are cutaway drawings of the pedestal assembly 10 of FIG. 1A. FIGS. 1K and 1L are cross-sectional drawings of the pedestal assembly 10 of FIG. 1A. These drawings depict components of the pedestal assembly 10 including a pedestal 100, a pedestal adapter 150, a high temperature electrode connection assembly 200, and a thermocouple connector assembly 400. During some newer fabrication processes, temperatures at a wafer-processing pedestal may cycle between 20° C. and 550° C. or greater. To withstand such high temperature cycling, components of the pedestal may include ceramic materials or other materials compatible with high-temperature environments that are also suitable for use in semiconductor processing environments, e.g., resistant to chemical or plasma attack.

The pedestal adapter 150 may have a radially symmetric shape in the form of a substantially cylindrical tube with a radial array of fluted recesses. The pedestal adapter 150 may be connected with bolts within the fluted recesses to the pedestal 100. The high temperature electrode connection assembly 200 includes four electrical connectors extending through apertures in a plate in the pedestal adapter 150. The four electrical connectors connect to one or more power sources or electrical connections outside the pedestal adapter 150. The thermocouple connector assembly 400 has an electrical connector, depicted here as a 9-pin connector. This electrical connector connects to a processor or other connector to communicate one or more electrical signals with temperature data from a thermocouple in the pedestal to the processor for processing the temperature data.

Figure 2A:
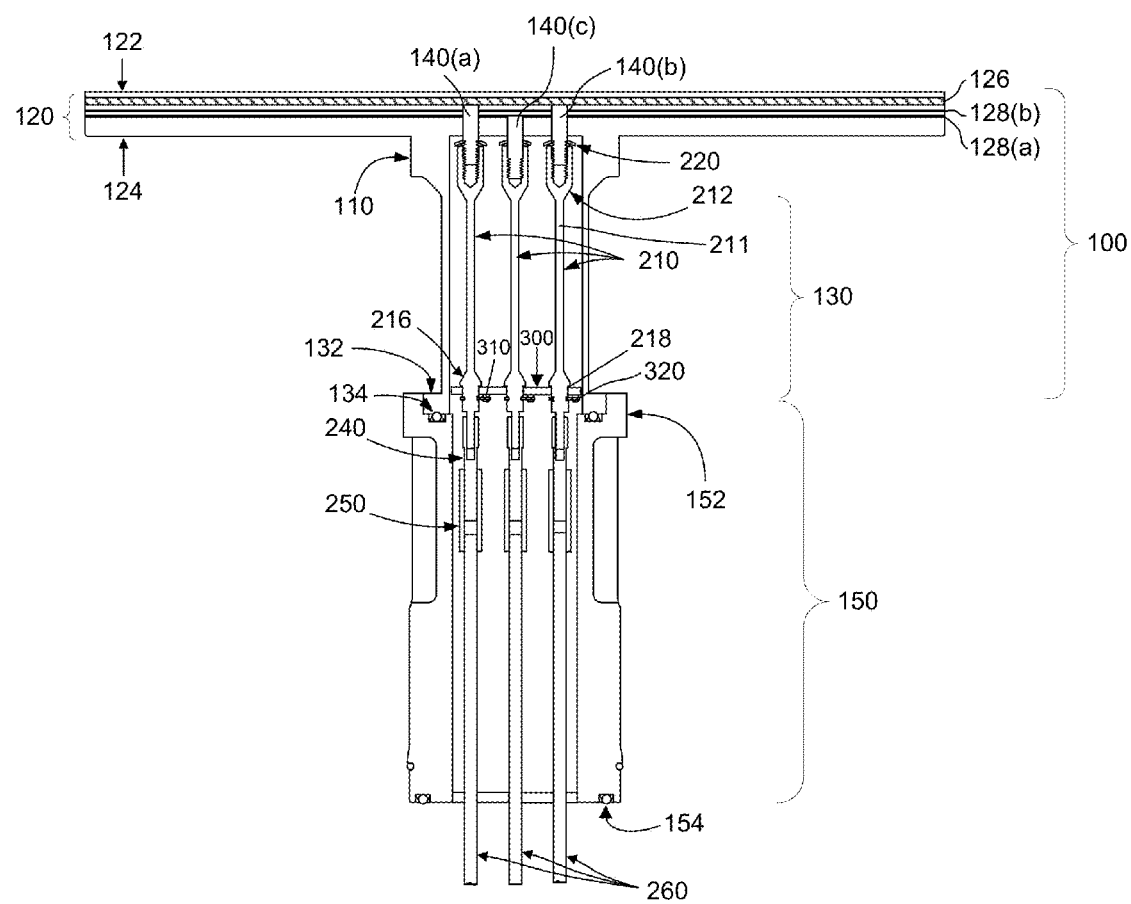
FIG. 2A is a line drawing of a cross-sectional view of components of a pedestal assembly, according to disclosed embodiments.
Figure 2B:
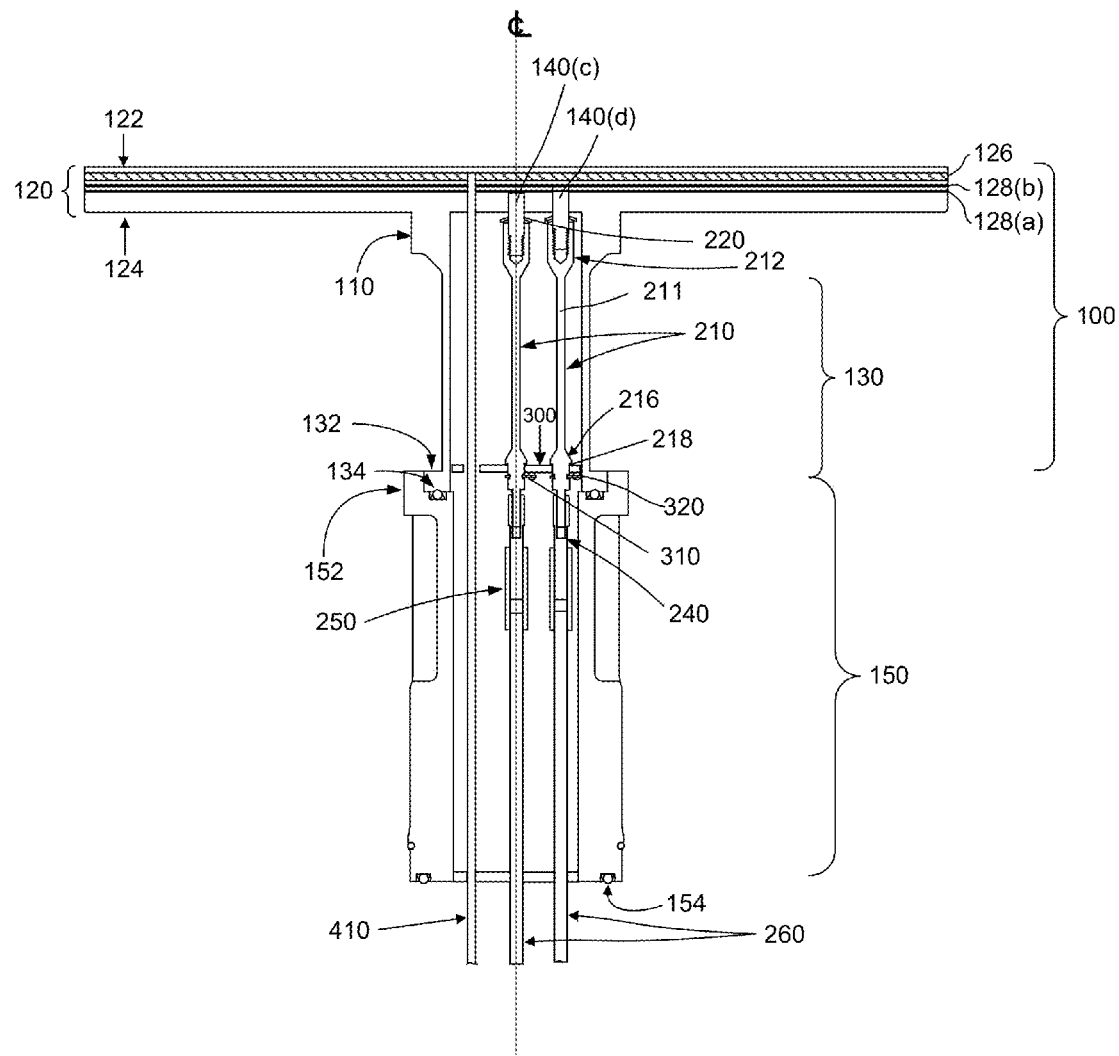
FIG. 2B is a line drawing of another cross-sectional view of components of the pedestal assembly depicted in FIG. 2A.

FIG. 2A is a line drawing of a cross-sectional view of components of a pedestal assembly 10, according to disclosed embodiments. The cross-sectional view of FIG. 2A is at a first plane through a centerline axis of the pedestal 100. FIG. 2B is a line drawing of another cross-sectional view of components of the pedestal assembly 10 depicted in FIG. 2A. This view is at a second plane orthogonal to the first plane and also through the centerline axis of the pedestal 100. The pedestal assembly 10, depicted in FIGS. 2A and 2B, includes a pedestal 100, pedestal adapter 150, high temperature electrode connection assembly 200 having a floating plate assembly, and includes and thermocouple connector assembly 400.

The pedestal 100 of disclosed embodiments is radially symmetric about the centerline. The pedestal 100 includes a base 110, a wafer support 120, and a stem 130. The wafer support 120 includes a structure or combination of structures that can receive and support a wafer during processing. The wafer support 120 may be of any size, shape, and material (e.g., aluminum nitride or alumina) suitable for the particular processing techniques of interest. In FIGS. 2A and 2B and other disclosed embodiments, the wafer support 120 is in the shape of ceramic disc that includes support surface 122 for receiving and supporting a wafer and a backside surface 124.

The wafer support 120 may also include device(s) that can assist with semiconductor processing. In FIGS. 2A and 2B and other illustrations, the wafer support 120 includes a heater element 126, a first RF antenna 128(a), and a second RF antenna 128(b). The heater element 126, first RF antenna 128(a), and second RF antenna 128(b) may be embedded within the wafer support 120 as shown in FIGS. 2A and 2B and other illustrations, or may be separate components. Although a single heater element 126 and two RF antennas 128(a) and 128(b) are shown, greater or fewer numbers of these devices can be included in other embodiments.

The heater element 126 can refer to device(s) capable of generating heat. For example, the heater element 126 may be a resistance heating element that generates heat when supplied with a voltage difference between two ends of the element. In one case, the heater element 126 may be a resistance heating element comprising a metal (e.g., tungsten) strip, ribbon or wire patterned or routed (e.g., along a serpentine or other path that would produce a desired heat distribution across the wafer support 120) within the wafer support 120 such that the two ends of the heater element 126 are accessible for applying a voltage difference. In some implementations, the wafer support 120 may be a ceramic part and the heater element 126 may be formed by a conductive trace pattern that is deposited on a layer of the wafer support 120 during manufacturing and that is then overlaid with additional sintered ceramic material.

Each of the RF antennae 128(*a*) and 128(*b*) may be configured to transmit RF energy from the pedestal 100, and may be provided by a layer of conductive material embedded within the wafer support 120. The RF energy can be used in a manufacturing process such as, for example, plasma enhanced chemical vapor deposition (PECVD) of target materials above the wafer located on the pedestal 100. Each of the RF antennae 128(*a*) and 128(*b*) may be provided by a layer of conductive material that is deposited on an internal surface of the wafer support 120 during manufacturing of the wafer support 120 and that is then overlaid with additional ceramic material.

In FIGS. 2A and 2B and other disclosed embodiments, the heater element 126 is embedded within the wafer support 120 and the first and second RF antennae 128(*a*) and 128(*b*) are at different layers within the wafer support 120. The heater element 126 and first and second RF antennae 128(*a*) and 128(*b*) may be located at other portions of the wafer support 120 in other cases.

The stem 130 of the pedestal 100 may be a column of a smaller diameter than the wafer support 120. The stem 130 may be configured to allow power and signal cabling or electrical conductors for the first and second RF antennae 128(*a*) and 128(*b*) and heater element(s) 126 to be routed within. In FIGS. 1 and 2 and other disclosed embodiments, the stem 130 is of a generally axially symmetric shape, for example, a flanged cylindrical tube having a circular stem flange 132. A stem seal 134 (e.g., O-ring seal or other suitable seal) may be used to seal the interface between the stem 130 and the pedestal adapter 150. In illustrations such as shown in FIGS. 2A and 2B, the stem 130, wafer support 120 and base 110 are integral (e.g., fused together) parts of the pedestal 100. Other integrations of the components of the pedestal 100 may be used, for example, separate components may be bolted together.

The stem 130, wafer support 120, and base 110 may be made of any material compatible with the manufacturing processes of interest. In one case, the stem 130 may be made of material with a lower thermal conductivity than the material of the base 110 and wafer support 120 in order to reduce the transfer of heat to the stem seal 134, which may only function properly at lower temperatures (e.g., between 200 and 300 degrees C.). For example, the stem 130 and wafer support 120, and base 110 may be made of a material combination (e.g., different compositions of aluminum nitride) that lower the temperature from 550 degrees C. at the wafer support 120 to a temperature at the stem seal 134 in the range of 200-300 degrees C.

One or more electrode studs 140 may be used to provide electrical connectivity from devices (e.g., heater element(s) 126 and RF antennas 128(*a*) and 128(*b*)) within the wafer support 120 to outside the wafer support 120. The electrode studs 140 may be embedded within the wafer support 120. A portion of each embedded stud 140 may extend out from the backside surface 124 (or other surface) to connect to other electrical components. In illustrated examples, the electrode studs 140 extend out from the backside surface 124 within the open center portion of the stem 130. In these examples, the portion of each electrode stud 140 extending outside the wafer support 120 includes a connecting (e.g., threaded) portion and may have, for example, an M5 thread.

The electrode studs 140 can be of any material (e.g., Tungsten) suitable for electrical conductivity and/or thermal expansion restrictions. In some cases, the electrode studs 140 are made of tungsten to approximately match the coefficient of thermal expansion (cte) of the material of the wafer support 120 (e.g., aluminum nitride) in order to reduce thermal stresses at the interface between the electrode studs 140, the wafer support 120, and the components within the wafer support 120 with which the electrode studs 140 connect, e.g., the heater element 126 and the RF antennae 128(*a*) and 128(*b*). Although the electrode studs 140 can be of different lengths and diameters, the electrode studs 140 of the illustrated examples are of a uniform length and diameter.

In FIGS. 2A and 2B and other illustrated embodiments, the wafer support 120 has four electrode studs 140 including a first electrode stud 140(*a*), a second electrode stud 140(*b*), a third electrode stud 140(*c*), and a fourth electrode stud 140(*d*). These four electrode studs 140 extend from the backside surface 124 of the wafer support 120 into the open center portion of the stem 130. The first and second electrode studs 140(*a*) and 140(*b*) are in electrical connectivity with two ends of the heater element 126, respectively. The third and fourth electrode studs 140(*c*) and 140(*d*) are in electrical connectivity with the first and second RF antennae 128(*a*) and 128(*b*), respectively. Although four electrode studs 140 are shown in illustrated embodiments, other numbers suitable to connect to corresponding devices in the pedestal 100 can be used in other cases. For example, in a pedestal 100 that does not include a heater element 126, the first electrode stud 140(*a*) and the second electrode stud 140(*b*) may be omitted.

The pedestal assembly 10 may also include a thermocouple connector assembly 400 (as shown in FIGS. 1A and 1B) including a thermocouple 410 with an temperature sensing end embedded in the wafer support 120 as shown in FIG. 2B and other illustrated examples. The end is located at or near the support surface 122. In some implementations, such a sensor may not be present, or such functionality may be provided using other technologies, e.g., thermistors or other temperature sensing devices. A cable or other electrical connector may connect the thermocouple or other temperature sensing device with a controller or other electrical devices, which may be located outside the pedestal adapter 150 in some cases. In FIGS. 1A and 1B, an electrical connector with a 9-pin connector end is connected to the thermocouple 410. The electrical connector may connect to a processor (e.g., controller) or other connector to communicate one or more electrical signals with temperature data from the thermocouple or other temperature sensing device.

The pedestal 100 may also include a pedestal adapter 150 having an adapter flange 152. The pedestal adapter 150 may be of any shape suitable for adapting to the shape of the stem 130. In FIGS. 2A and 2B and other examples, the pedestal adapter 150 is of a generally axially or radially symmetric shape, e.g., a substantially cylindrical tube with a radial array of fluted recesses (shown in FIGS. 1A and 1B). The stem seal 134 may be located between the adapter flange 152 and the pedestal stem flange 132. An adapter seal 154 (e.g., O-ring seal or other suitable seal) may be located at the pedestal adapter 150. The pedestal stem 130 and pedestal adapter 150 form an interior space which is sealed at least at stem seal 134 and adapter seal 154. Generally, the seals keep the interior at positive pressure where a vacuum or low pressure environment may be kept on the exterior. In one embodiment, a gas may be pumped into the interior space of the pedestal stem 130 and pedestal adapter 150, e.g., an inert/purge gas may be pumped into the interior space to provide positive pressure and to prevent process gases from potentially leaking into the interior space and interfering with the components within. Although two seals 134, 154 are shown, any number of seals can be used.

—High Temperature Electrode Connection Assembly

In disclosed embodiments, the pedestal assembly 10 includes a high temperature electrode connection assembly 200 (also called electrode assembly 200) having one or more electrode rods 210. In FIGS. 2A and 2B and other illustrated examples, the high temperature electrode assembly 200 includes four electrode rods 210. The electrode rods 210 are shown as single-piece structures in many examples, but may also be manufactured in separate pieces and then assembled or affixed together. In disclosed embodiments, the electrode rods 140 extend a short distance (e.g., one inch) below the pedestal stem 130, thus making the electrode rods 140 less prone to snagging on clothing, personnel, or other items during maintenance and handling, and reducing the potential bending loads exerted on the electrode rods 140 as compared, for example, to a design in which the electrode rods extend from the pedestal to a much greater degree, e.g., on the order of 9 inches.

Each electrode stud 140 may have a corresponding electrode rod 210. In some implementations, there may be fewer electrode rods 210 than electrode studs 140. Each electrode rod 210 provides electrical connectivity between one or more electrode studs 140 and a power terminal or electrical connector outside the pedestal 100. Each power terminal or connector is configured to connect with a power source or electrical connection, which is typically in or outside the pedestal adapter 150.

Figure 3A:
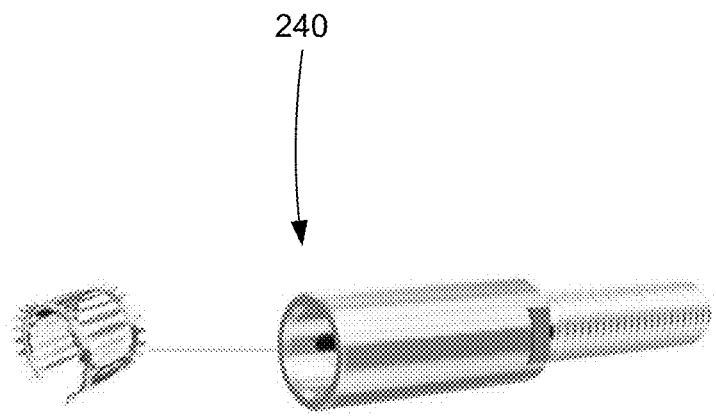
FIG. 3A is a drawing in a perspective view of an exemplary multi-contact socket as used in disclosed embodiments.

In disclosed embodiments, the high temperature electrode connection assembly 200 may include a series of electrical connectors providing electrical connectivity between each of the electrode rods 210 and one or more power sources or electrical connections outside the pedestal adapter 150. For example, the high temperature electrode connection assembly 200 of FIGS. 2A and 2B include one or more multi-contact sockets (or other connectors) 240 that are located within the interior space of the pedestal adapter 150 and that are each configured to receive the end of one of the electrode rods 210. FIG. 3A is a drawing in a perspective view of an exemplary multi-contact socket 240 that may be used in some cases. In FIGS. 2A and 2B, each multi-contact socket 240 provides electrical connectivity between each electrode rod 210 and, for example, a crimp socket 250. The crimp socket 250 can provide electrical connectivity between the multi-contact socket 240 and a lead 260 as shown. The lead 260 can provide electrical connectivity between the crimp socket 250 and other electrical connectors or a power source, which are typically located outside the pedestal adapter 150.

In FIGS. 2A and 2B and other illustrated embodiments, the high temperature electrode assembly 200 includes four leads 260. Two of the leads 260 are heater leads electrically connected to the electrode rods 140 that may be electrically connected to the electrode studs 140(a) and 140(b), which may be electrically connected to the heater element 126. The other two leads 260 are electrodes electrically connected to the electrode rods 210 that may be electrically connected to the electrode studs 140(c) and 140(d), which may be electrically connected to the RF antennae 128(a) and 128(b) respectively.

Figure 3B:
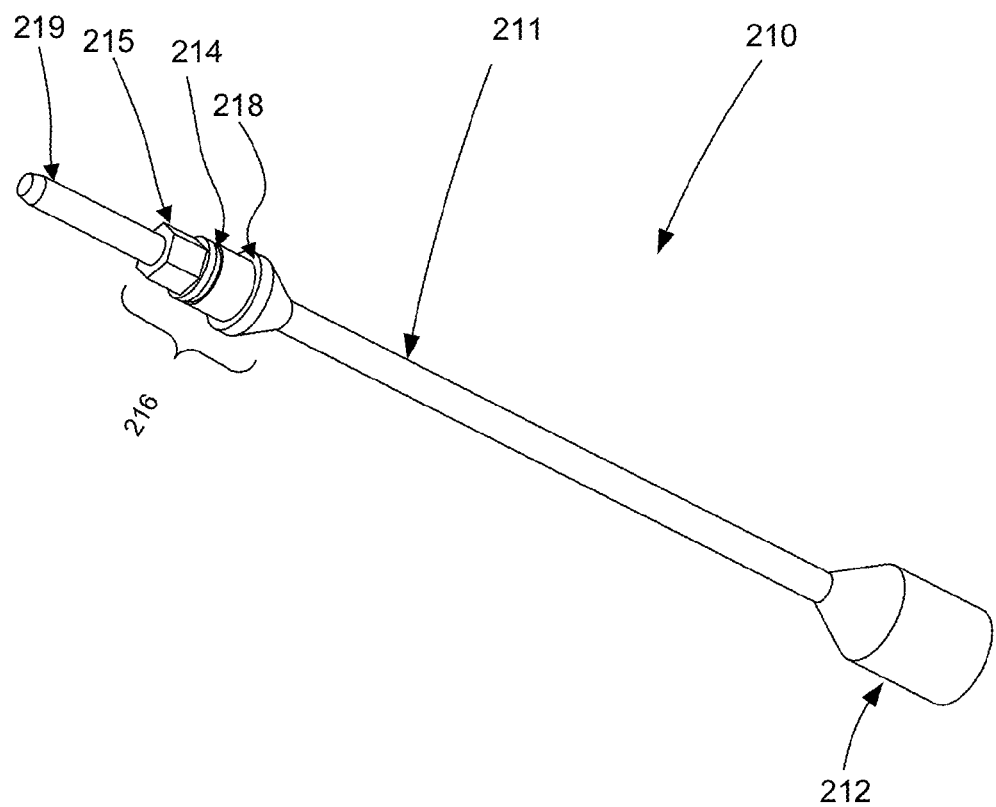
FIG. 3B is a line drawing model drawing in a perspective view of an exemplary single-piece electrode, according to embodiments.

FIG. 3B is a line drawing in a perspective view of an exemplary single-piece electrode 210 of disclosed embodiments. The electrode rod 210 includes a stem 211, a cup 212 at one end of the stem 211, a plate adapter portion 216 at an opposing end of the stem 211, a shoulder 218 built into the plate adapter portion 216, a threaded portion 213 within the cup 212 (see FIG. 4), a circumferential groove 214 in the plate adapter portion 216, a wrenching feature 215, and an end connector 219. The cup 212 can be of any suitable shape for attaching to the electrode studs 140, although, in many implementations, the entire electrode rod 210 will be a substantially axially symmetric part. In some implementations, the electrode rod 210 may have one or more flats or other wrenching features located on the cup 212 or on other portions of the electrode rod 210. In FIG. 3B, the electrode rod 210 has a wrenching feature 215 located at the opposite end of the stem 211 from the cup 213. In this illustrated example, the wrenching feature 215 may be located outside the floating plate 300 for tightening or loosening of the electrode rod 210 to the electrode stud 140.

The material selection and features of the electrode rod 210 may be designed to reduce the transfer of heat from the pedestal 100 in some cases. For example, the stem 211 of the electrode rod 210 may have a smaller cross sectional area relative to the cup 212, such as shown in FIG. 3B, to reduce the transfer of heat through the electrode stem 211 to the plate adapter portion 216 and into the pedestal adapter 150. In one case, the ratio of the outer diameters of the cup 212 to the stem 211 may be between about 2:1 to 5:1. In another case, the ratio of the cross-sectional areas of the cup 212 to the stem 211 may be between about 2:1 to 5:1.

In some embodiments, the electrode rods 210 are made of 316 SST with palladium (Pd) plating. In other embodiments, the electrode rods 210 are made of 316 SST with rhodium (Rh) plating. Plating, such as Pd plating or Rh plating, may provide long term oxidation resistance to the 316 SST, and provide high electrical conductivity. The 316 SST provides low thermal conductivity and low electrical resistivity, and is chemically compatible with Pd plating or Rh plating. In some implementations, Ni electrode rods with such plating may be used, although this may be more expensive.

Figure 4:
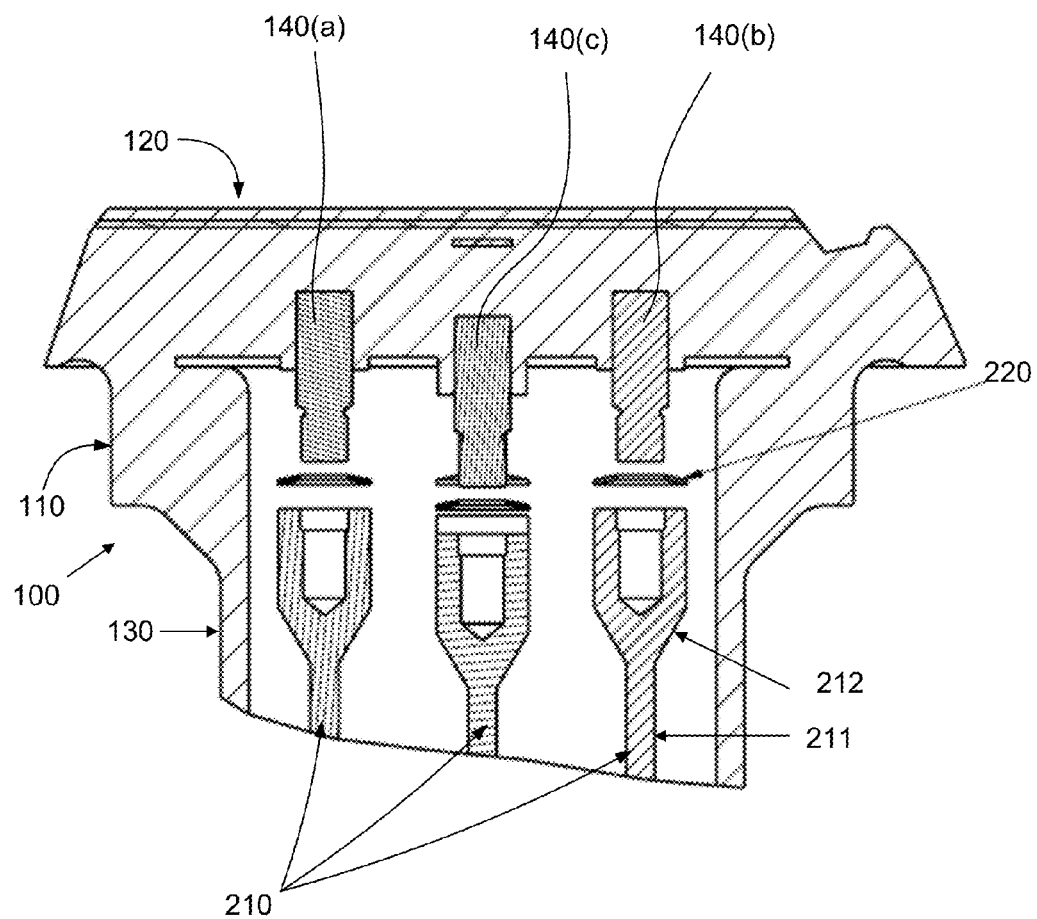
FIG. 4 is a line drawing of a cross-sectional view of components of a portion of a pedestal assembly having four electrode rods connected to four electrode studs, according to embodiments.

FIG. 4 is a line drawing of a cross-sectional view of components of a cross-sectional view of a portion of a pedestal assembly 10 having four electrode rods 210 connected to four electrode studs 140(a), 140(b), 140(b), and 140(d), according to embodiments. The cross-section shown in FIG. 4 is at a first plane through a centerline axis of the pedestal 100.

In embodiments such as the one shown in FIG. 4, one or more Belleville washers 220 may be located between the cups 212 of the electrode rods 212 and shoulders on the electrode studs 140. The Belleville washers 220 may be made from Palladium plated Inconel 718 or Rhodium plated Inconel 718 in some cases. During an exemplary installation, the electrode rods 210 may be threaded onto the electrode studs 140, compressing the Belleville washers until they have bottomed out, i.e., substantially flattened. The electrode rods 210 may then be backed off by a predefined number of degrees (e.g., 5 degrees, 10 degrees, 15 degrees, etc.) to release some of the load on the Belleville washers 220. In one implementation, the electrode rods 210 may be rotated by between 5 to 15 degrees to release some, but not all, load from the Belleville washers 220. This installation may, due to the pre-load induced in the Belleville washers 220, allow for the Belleville washer 220 to provide reliable physical contact for electrical connectivity while still allowing for some play from thermal expansion to be taken up by the washer 220.

The material selection and design of features of components of the pedestal assembly 10 may step down thermal conductivity away from the pedestal 100 in order to reduce the transfer of heat to components outside the pedestal 100. For example, the stem 130 may be made of material with lower thermal conductivity than the material of the wafer support 120 in order to reduce the transfer of heat to the stem seal 134, which may only function properly at lower temperatures (e.g., between 200 and 300 degrees C.). In one case, the stem 130 and wafer support 120 may be made of a material combination (e.g., different compositions of aluminum nitride) that reduce the temperature from 550 degrees C. at the wafer support 120 to a temperature at the stem seal 134 in the range of 200-300 degrees C. As another example, the stem 211 of the electrode rod 210 may have a smaller cross sectional area relative to the cup 212 to reduce the transfer of heat through the electrode stem 211 to the plate adapter portion 216. In one case, the ratio of the cross-sectional areas of the cup 212 to the stem 211 may be between about 2:1 to 5:1. The design of the electrode rod material and physical configuration may reduce the temperature at the electrical socket at the end of the electrode rod 210 to at or below 150 degrees in some cases.

—Floating Plate Assembly

The high temperature electrode connection assembly 200 may also include a floating plate assembly in disclosed embodiments. The floating plate assembly includes a floating plate 300, one or more anti-rotation retainer rings 310, and one or more anti-rotation posts 320, shown in FIGS. 2A and 2B and other illustrated examples.

The floating plate 300 may be a circular plate structure with one or more apertures for receiving corresponding electrode rods 210 and an outer portion that contacts the inside of the pedestal stem 130 to resist lateral movement of the electrode rods 210. The floating plate 300 may also include an anti-rotation feature (e.g., flat) on the outside of the plate that may contact an opposing flat on the inside of the stem 150 of the pedestal 100 to resist rotation of the floating plate 300 relative to the stem 150. In some cases, the floating plate 300 may also have one or more additional apertures for receiving the thermocouple 410, other electrical connectors (e.g., cabling), and other devices. The apertures in the floating plate 300 may be sized so as to allow the plate adapter portion 216 to pass through with a small amount of clearance, but to prevent the shoulder 218 from passing through. Each of the anti-rotation retainer rings 310 may be snapped or otherwise placed into the circumferential groove 214 in the plate adapter portion 216 such that the retainer rings 310 act as opposing "shoulders" on the side of the floating plate opposite the shoulders 218 of the electrode rods 210. Thus, the floating plate 300 may be held at the shoulders 218 from further movement along the centerline axes of the electrode rods 210 or otherwise supported by the electrode rods 210 within the pedestal stem 130. The floating plate 300 may be sized to be of a slightly smaller diameter than the internal diameter of the pedestal stem 130 to allow the floating plate 300 to move in both directions along the centerline axes of the electrode rods 210 relative to the pedestal stem 130. This relative movement can allow for thermal expansion or contraction of the electrode rods 210. The pedestal stem 130, correspondingly, may be configured to allow for such free axial movement of the floating plate 300. The floating plate 300 may be ceramic, or may be of other thermally insulating material and/or electrically insulating material that is capable of withstanding high temperature.

Each anti-rotation retainer ring 310 may be a conventional external snap ring or other similar device that is configured to clamp around the plate adapter portion 216 of the electrode rods 210 and frictionally engage with the plate adapter portion 216. As mentioned above, each plate adapter portion 216 may have a circumferential groove 214 sized to receive an anti-rotation retainer ring 310. The clamping force may be provided by the elastic deformation of the anti-rotation retainer rings 310 that results when the anti-rotation retainer rings 310 are placed into the groove 214 on the plate adapter portions 216. The anti-rotation retainer rings 310 may have one or more anti-rotation features that protrude out from the nominal outer diameter of the retainer rings 310, e.g., the ears of a snap ring. The anti-rotation features may engage with the anti-rotation posts 320 that are fixed with respect to the floating plate 300.

Each anti-rotation post 320 can be a structure attached or integral to the floating plate 300 that provides a rotational stop for the anti-rotation retainer ring 310. The anti-rotation retainer ring 310 can resist or prevent rotation of the electrode rod 210 when stopped by the anti-rotation post 320. When contacting the anti-rotation post 320, the anti-rotation retainer ring 310 can prevent the threaded joints between the cups 212 of the electrode rods 210 and the electrode studs 140 from backing off and loosening, which may affect the electrical performance of the system. This installation may allow for longer times between periodic maintenance of the pedestal 100 to tighten the joints.

The anti-rotation retainer rings 310 may be installed and/or adjusted after the electrode rods 210 are installed and the Belleville washers 220 are preloaded. For example, after the electrode rods 210 are in the desired installation state, e.g., with Belleville washers fully compressed, the retainer rings 310 may be opened slightly to reduce or eliminate the clamping force, and may then be rotated about the center axis of the electrode rod 210 until they are in close proximity to, or contacting, the anti-rotation posts 320. In some embodiments, there is a designed gap of a predefined size (e.g., 0.040 inch) between the anti-rotation retainer ring 310 and the shoulder 218 of the electrode rod 210 to allow the floating plate 300 to accommodate differential axial thermal expansion between the assorted electrode rods 210.

Figure 5:
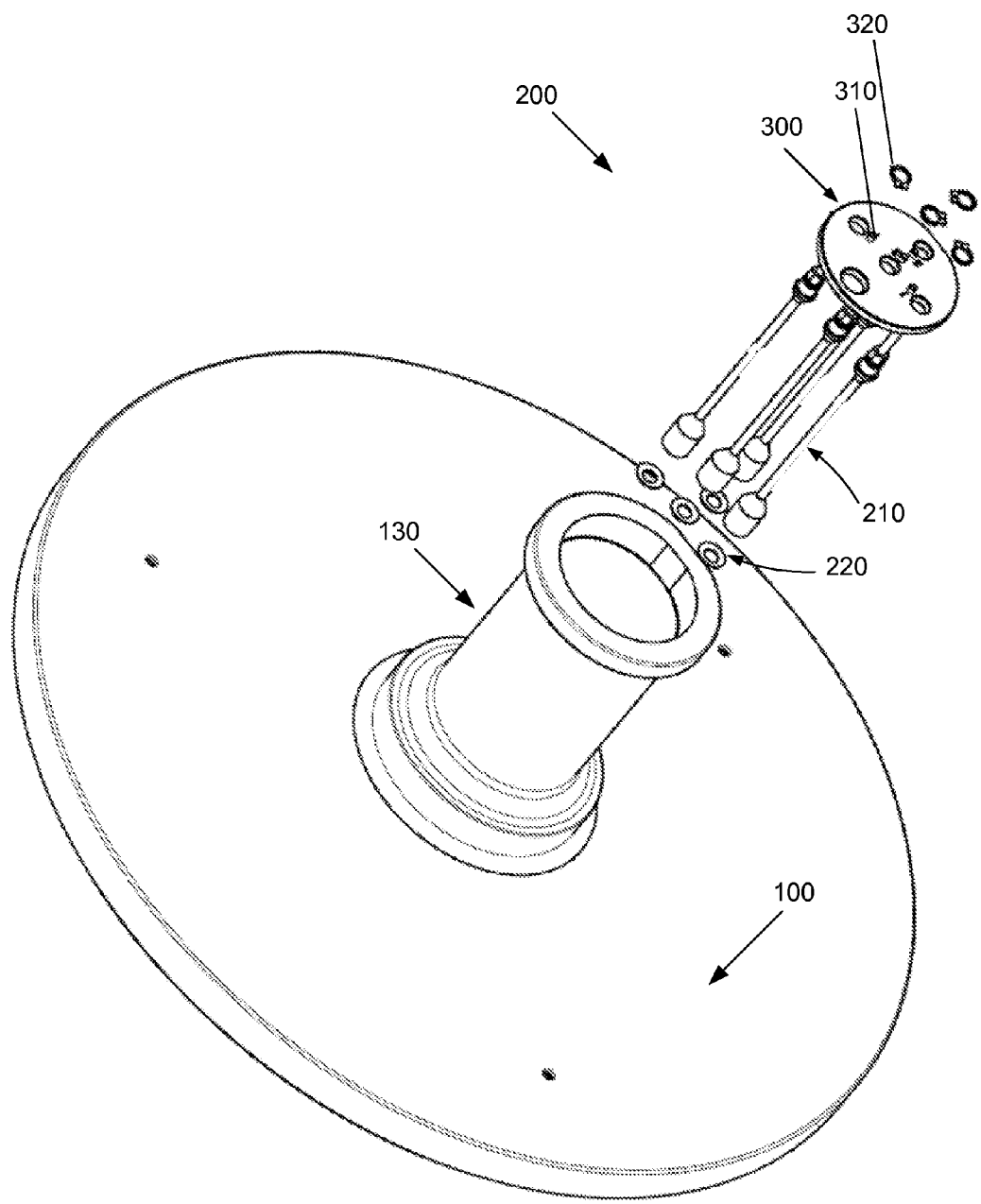
FIG. 5 depicts an exploded view of components of the high temperature electrode connection assembly and the pedestal from the pedestal assembly of FIGS. 1A and 1B.

FIG. 5 depicts an exploded view of components of the high temperature electrode connection assembly 200 and the pedestal 100 from the pedestal assembly 10 of FIGS. 1A and 1B. This view shows how these components may be assembled in certain implementations. For example, the electrode rods 210 can be attached to the electrode studs 140 within the center portion of the pedestal stem 150. The Belleville washers 220 are located between cups of the electrode rods 210 and shoulders on the electrode studs 140 embedded in the pedestal 100. The floating plate 300 can slide into the pedestal stem 150. In this embodiment, the floating plate 300 has five apertures. Four of these apertures receive four electrode rods 210. One of the apertures receives a connector to the thermocouple 410 (shown in FIG. 1A). The floating plate 300 can be fit into the pedestal stem 150 to locate the apertures of the floating plate 300 over the electrode rods 210. The electrode rods 210 may be tightened to flatten and preload the washers 220. The anti-rotation retainer rings 320 can then be attached around the ends of the electrode rods 210 within the circumferential grooves. In some cases, the electrode rods 210 may then be loosened to release preload from the washers 220. The anti-rotation retainer rings 320 are placed in contact with the anti-rotation posts 310 to stop loosening rotation of the electrode rods 210.

Figure 6A:
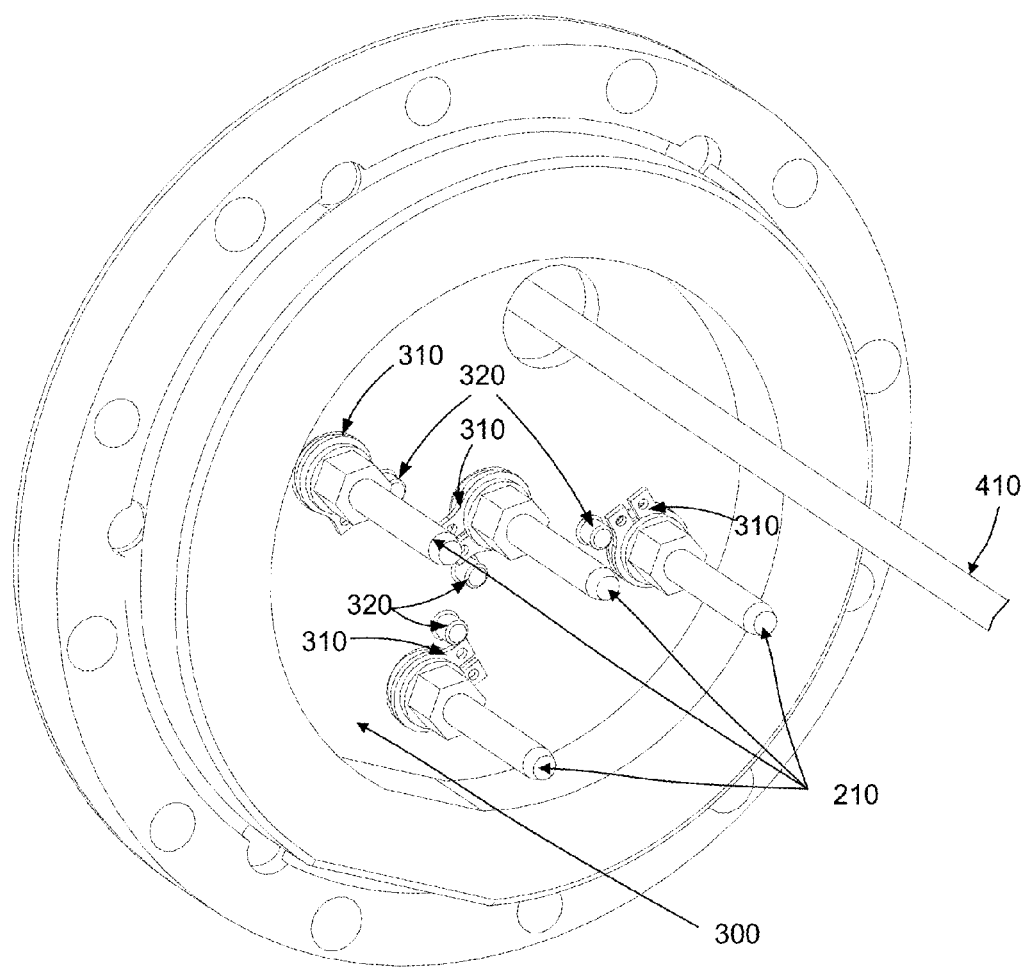
FIG. 6A is a drawing showing a perspective view of components of the pedestal assembly of FIGS. 1A and 1B and other disclosed embodiments.

FIG. 6A is a drawing showing a perspective view of components of the pedestal assembly 10 of FIGS. 1A and 1B and other disclosed embodiments. This view shows some of the details of the floating plate assembly and other components of the high temperature electrode connection assembly. In this illustration, a floating plate 300, four anti-rotation retainer rings 310, and four anti-rotation posts 320 are shown after installation of the floating plate assembly. The ends of four electrode rods 210 and a thermocouple 410 are shown protruding through the floating plate 300.

The ends of the electrode rods 210 that extend beyond the pedestal 100 may be laterally secured by the floating plate 300 that is captured by anti-rotation retainer rings 310 on the electrode rods 210. The anti-rotation retainer rings 310 also bear up against anti-rotation posts 320 on the floating plate 300 and resist or prevent rotation so the electrode rods 210 may not un-screw. A socket-type connector, such as the multi-contact socket 240 shown in FIG. 3A, can be used to slip onto the protruding ends of the electrode rods 210 and can be supported inside ceramic tubes. These ceramic tubes can be retained by a retainer, for example. The electrode rod material and physical configuration may keep the electrical socket at or below 150 degrees C.

The floating plate 300 of some embodiments includes at least one index mark associated with each aperture receiving an electrode rod 210. The index mark can be used to locate a feature of each anti-rotation retainer ring 310 to identify a rotation of the electrode rod 210 and/or associated preload on a Belleville washer 220 during installation. For example, a first index mark around each of these apertures can be associated with a first position of the anti-rotation retainer rings 310. The first position may be the position of each anti-rotation retainer ring 310 when the electrode rod 210 has been tightened enough to provide preload to the associated Belleville washer 220. For example, the first position may be the position of the anti-rotation retainer ring 310 when the electrode rod 210 has been tightened to substantially flatten the Belleville washer 220. The second position of the anti-rotation ring 310 may be in contact with or in close proximity to the anti-rotation post 310. In implementations, the first index mark may also be associated with a partial release of the Belleville washer 220 from preload by rotating the electrode rod 210. For example, the first index mark may indicate a predefined number of degrees (e.g., 0 degrees, 5 degrees, 10 degrees, 15 degrees, etc.) of rotating the electrode rod 210 to partially release preload from the Belleville washer 220. Additional index marks may be used to designate different predefined number of degrees.

Figure 6B:
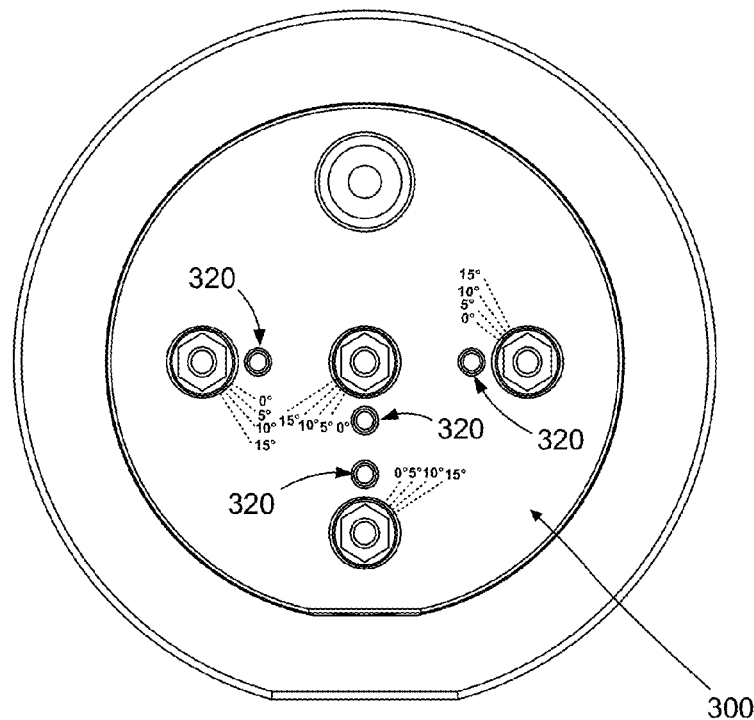
FIG. 6B is a drawing showing of an end view of some of the components shown in FIG. 6A before installing of the anti-rotation retainer rings and after preloading the washers.
Figure 6C:
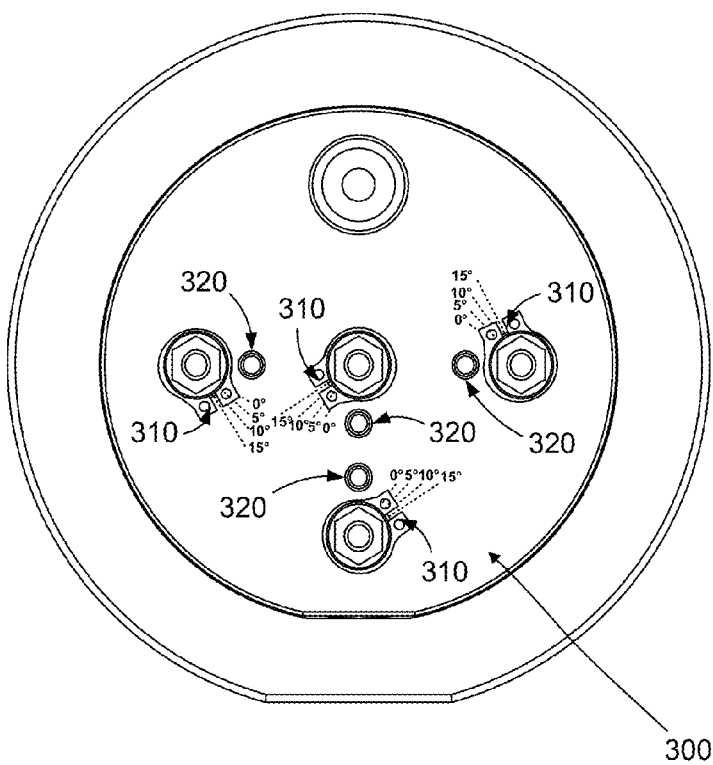
FIG. 6C is a drawing of an end view of components shown in FIG. 6B after installation of the anti-rotation retainer rings.
Figure 6D:
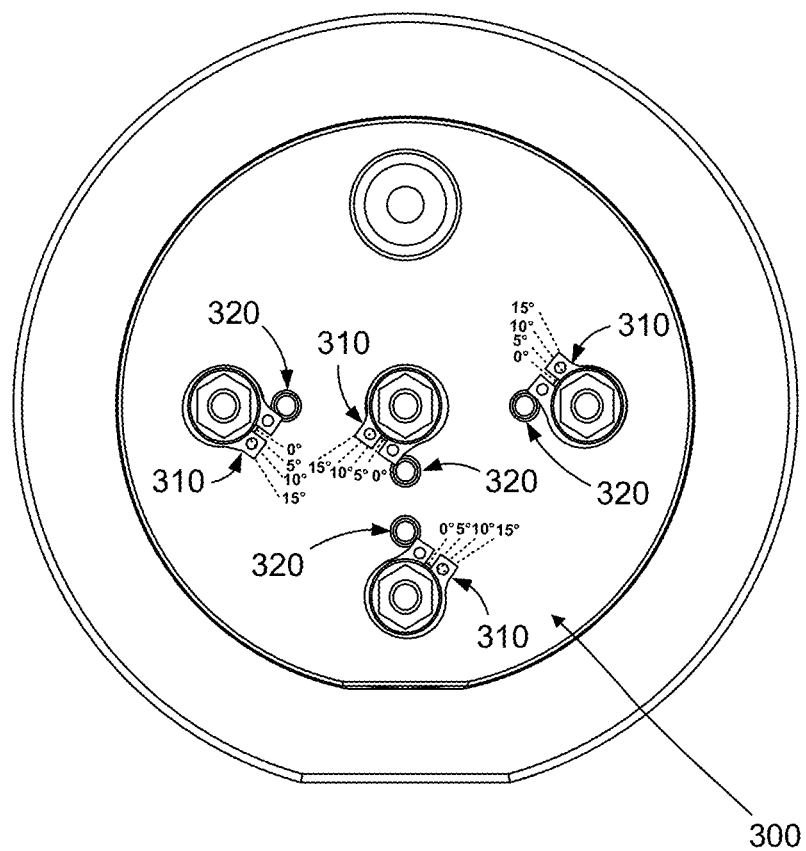
FIG. 6D is a drawing of an end view of components shown in FIG. 6B after rotating the rods to contact the anti-rotation posts and lessen the preload on the washers.

FIG. 6B is a drawing showing of an end view of some of the components shown in FIG. 6A before installing the anti-rotation retainer rings 310 and after preloading the washers 220. FIG. 6C is a drawing of an end view of components shown in FIG. 6B after installation of the anti-rotation retainer rings 310. FIG. 6D is a drawing of an end view of components shown in FIG. 6B after rotating the electrode rods 210 to contact the anti-rotation posts 320 and lessen the preload on the washers 220. In FIGS. 6B, 6C and 6D, the floating plate 300 includes a set of four index marks around the apertures that receive the electrode rods 210. These four index marks indicate first position at "0°," "5°," "10°," and "15°" respectively corresponding to 0, 5, 10, and 15 degrees of rotation of the anti-rotation retainer rings 310 about the electrode rods 210 to a second position in contact with or in close proximity to the anti-rotation posts 310. In this embodiment, the 0° index mark indicates the position where each anti-rotation retainer ring 310 is in contact with or is in close proximity to an associated anti-rotation post 320 to resist rotationally loosening of the associated electrode rod 210. In other embodiments, more or fewer index marks may be used. In addition, the index marks may have other designations to indicate positions (e.g., "begin" and "end," "start" and "stop," "first" "second," "third," "fourth," etc.). In some implementations, the index mark indicating contact with or proximity to the anti-rotation post 320 may, instead of being explicitly marked, inferred from the limiting effect of the anti-rotation post.

During installation, an installer may line up a feature on the anti-rotation retainer rings 310 with one or more of the index marks during installation. For example, the slot between the flaps of the anti-rotation ring 310 in FIGS. 6B, 6C, and 6D can be lined up with one of the four index marks during installation. In FIG. 6B, the electrode rods 210 have been tightened to preload the washers before the installation of the anti-rotation retainer rings 310, e.g., tightened until the washers have bottomed out. In FIG. 6C, the anti-rotation rings 310 have been installed at a first index mark of 15° in a first position. After installing the anti-rotation rings 310 at the first index mark of 15°, the electrode rods 210 can be rotated in the counterclockwise direction to loosen the preload on the washer and until the anti-rotation rings 310, which rotate with the electrode rods 210, contact or are in close proximity to the anti-rotation posts 210, as shown in FIG. 6D.

In one implementation, an installer may rotate the electrode rods 210 to preload the Belleville washers 220. An anti-rotation retainer ring 310 can then be clamped onto the outside of each electrode rod 210 so that a feature on each anti-rotation retainer ring 310 lines up to one of the 0°, 5°, 10°, and 15° index marks. The installer may then release the Belleville washers 220 from preload by loosening each electrode rod 210 until the feature on the clamped anti-rotation retainer ring 310 lines up with another index mark, such as the 0° mark, which can indicate contact with the anti-rotation post 320. In this example, each of the 0°, 5°, 10°, and 15° index marks indicates a predefined number of degrees of release from preload on the Belleville washers 220. For example, if the 15° index mark is used as the starting location of the anti-rotation retainer ring 310, an ending location at the 0° degree index mark would provide a release of 15° from preload.

Embodiments of the invention may provide one or more advantages over previous systems. For example, embodiments include a high temperature electrode connection assembly with high temperature electrode connections that may provide more reliable electrical connections to the RF and AC heater power connections (e.g., electrode studs 140) on a high temperature ceramic pedestal. In embodiments, the high temperature electrode connection assembly and a floating plate assembly are designed for easy and reliable assembly and disassembly during periodic maintenance cleaning procedures.

Embodiments of the invention may mitigate stresses at the electrode stud/electrode rod interface that may occur during assembly and during periodic maintenance (PM) procedures where the pedestal 100 needs to be removed and sent out for chemical cleaning as compared with pedestal designs with very long electrode rods, e.g., electrode rods that protrude from the base of the stem by, for example, approximately 9-12 inches. Specific advantages of components of the pedestal assembly 10 of embodiments may be associated with: 1) material selection of SST 316 Rh for the electrode rods 210 for low thermal conductivity and good electrical conductivity at high temperature, while still maintaining high temperature performance, mechanical strength, machinability, cost and plate-ability, 2) selection of Pd or Rh plating for the electrode rods 210 for its electrical properties, galling resistance, lack of high temperature oxidation (nobility), 3) floating plate restraint of the electrode rods 210 to allow for differential thermal expansion and manufacturing variations, 4) anti-rotation retainer rings (e.g., snap rings) to prevent rotation of the electrode rods 210, 5) the use of Belleville washers 220 to provide reliable electrical/RF connection and to mitigate differential thermal expansion issues associated with the threaded connection between the electrode rod 210 to an electrode stud 140 during cycling between ambient and 550 degree C. temperatures. Another specific advantage of embodiments may be the use of M5 threaded studs to increase strength. Another specific advantage may be that the electrode rods are shorter and only protrude beyond the base of the pedestal 1-2 inches.

Although depicted embodiments include certain components, fewer, additional, or different components may be included in the pedestals assembly 10 of embodiments. For example, although the pedestal assembly 10 of illustrations includes four (4) electrode rods 210, the pedestal assembly 10 of other embodiments may include 1, 2, 3, 5, 6, 7, or more electrode rods 210.

Installation Operations

During installation of the electrode rods 210 of disclosed embodiments, the electrode rods 210 mount to the thread of the electrode studs 140 (e.g., M5 thread) and have a washer 220 between the electrode rods 210 and the electrode studs 140 in the pedestal 100. The electrode rods 210 are torqued to compress and flatten the washer 220, and may then be backed off, e.g., by a predefined number of degrees (e.g., 5, degrees, 10 degrees, or 15 degrees, etc.) to allow the tension of the washer 220 to provide tension on the connection and make good electrical contact. This procedure also allows for a small amount of play in the connections that may prevent the differential expansion of the materials (pedestal stud is tungsten and the electrode rod is SST 316) from breaking the electrode studs 140 during high thermal cycling, such as cycles between ambient and 550 C.

During one exemplary installation operation, an installer may first mount the electrode rods 210 to the thread of the electrode studs 140 in the pedestal 100. A Belleville washer 220 is located between the cup of each electrode rod 210 and the pedestal 100. The floating plate 300 is then positioned within the stem 130 of the pedestal 100 while locating the electrode rods 210 within the apertures in the floating plate 300. The floating plate 300 may be located to contact the shoulders 218 of the electrode rods 210. The ends of the electrode rods 210 will then be protruding outside the floating plate 300. The installer may then tighten the electrode rods 210 to preload the Belleville washers 220. The Belleville washer 220 may be preloaded to flattening in some cases. The installer can then locate and clamp each anti-rotation retainer ring 310 around a protruding electrode rod 210 at the circumferential groove 214. The installer locates each anti-rotation retainer ring 310 to align a feature (e.g. slot between flaps as shown in FIG. 6B) on the anti-rotation retainer ring 310 to a first index mark on the floating plate 300. For example, the installer may line up the feature to a 15° index mark. The installer may then release the Belleville washers 220 from preload by loosening each electrode rod 210 until the feature lines up with a second index mark indicating contact with the anti-rotation post 320. For example, the installer may line up the feature to a 0° index mark. In this implementation, each of the 0°, 5°, 10°, and 15° index marks (shown in FIG. 6B) can indicate a predefined number of degrees of release from maximum preload on the Belleville washers 220. For example, if the first index mark is the 15° index mark and the second index mark is the 0° degree index mark, then the predefined number of degrees of release of the Belleville washer 220 is 15°.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Another aspect of the invention is an apparatus configured to accomplish the methods described herein. A suitable apparatus includes hardware for accomplishing the process operations and a system controller having instructions for controlling process operations in accordance with the present invention. The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the invention.

What is claimed is:

1. A high temperature electrode connection assembly for a wafer-processing pedestal comprising:
    an electrode rod having a plate adapter portion and a cup for mounting to a stud embedded in a pedestal;
    a floating plate having an outer surface and an aperture for receiving the electrode rod, the floating plate configured to contact an inner surface of the pedestal to resist lateral movement of the electrode rod;
    an anti-rotation retainer ring configured to frictionally engage the electrode rod; and
    an anti-rotation post extending from the outer surface of the floating plate, the anti-rotation post configured to limit rotation of the anti-rotational retainer ring such that the anti-rotation post and anti-rotational retainer ring are together configured to limit rotation of the electrode rod with respect to the floating plate.

2. The high temperature electrode connection assembly of claim 1, further comprising a Belleville washer installed between a shoulder of the stud and the cup, wherein the stud comprises a threaded portion and the cup comprises a complementary threaded portion.

3. The high temperature electrode connection assembly of claim 2, wherein the Belleville washer between the cup and the stud is substantially flattened.

4. The high temperature electrode connection assembly of claim 2, wherein the floating plate has one or more index marks for locating the anti-rotation retainer ring, and wherein a first one of the one or more index marks is associated with a preload on the Belleville washer.

5. The high temperature electrode connection assembly of claim 2, wherein the floating plate has one or more index marks for locating the anti-rotation retainer ring, and wherein a first one of the one or more index marks indicates a predefined number of degrees of release of the Belleville washer from preload.

6. The high temperature electrode connection assembly of claim 1, wherein the electrode rod is comprised of stainless steel with palladium plating.

7. The high temperature electrode connection assembly of claim 1, wherein the electrode rod is comprised of stainless steel with rhodium plating.

8. The high temperature electrode connection assembly of claim 1, wherein the anti-rotation retainer ring is a conventional external snap ring.

9. The high temperature electrode connection assembly of claim 1, wherein the plate adapter portion has a wrenching feature for rotating the electrode rod from outside the floating plate.

10. The high temperature electrode connection assembly of claim 1,
wherein the plate adapter portion has a circumferential groove, and
wherein the anti-rotation retainer ring frictionally engages the electrode rod at the circumferential groove.

11. The high temperature electrode connection assembly of claim 1, wherein the electrode rod also has a stem between the cup and the plate adapter portion, wherein a ratio of the outer diameters of the cup to the stem is between 2:1 and 5:1.

12. The high temperature electrode connection assembly of claim 1,
wherein the plate adapter portion has a shoulder, and
wherein the floating plate is located in a gap between the shoulder of the plate adapter portion and the anti-rotation retainer ring.

13. The high temperature electrode connection assembly of claim 1, further comprising a clearance gap between the floating plate and an inner surface of the pedestal for relative movement of the floating plate and the pedestal.

14. The high temperature electrode connection assembly of claim 1, wherein the floating plate is also configured to contact the inner surface of the pedestal to resist rotational movement.

15. The high temperature electrode connection assembly of claim 1, wherein the floating plate comprises a flat on the outside, wherein the flat is configured to contact an opposing flat on the inside surface of the pedestal to resist rotational movement.

16. A high temperature electrode rod comprising:
a cup for mounting to a stud embedded in a wafer-processing pedestal;
a plate adapter portion;
a stem between the cup and the plate adapter portion;
a circumferential groove in the plate adapter portion, the circumferential groove configured to frictionally engage an anti-rotation retainer ring, wherein the anti-rotational ring is configured to limit rotation of the electrode rod with respect to a floating plate when the anti-rotation retainer ring is in contact with an anti-rotation post, and
wherein the floating plate is configured to contact an inner surface of the wafer-processing pedestal to resist lateral movement of the electrode rod; and
a shoulder in the plate adapter portion for limiting axial movement of the floating plate.

17. The high temperature electrode rod of claim 16, wherein the electrode rod is made of stainless steel with palladium plating.

18. The high temperature electrode rod of claim 16, wherein the electrode rod is made of stainless steel with rhodium plating.

19. The high temperature electrode rod of claim 16, wherein the plate adapter portion has a wrenching feature at the plate adapter portion for rotating the electrode rod outside the floating plate.

20. The high temperature electrode rod of claim 16, wherein a ratio of outer diameters of the cup to the stem is between 2:1 and 5:1.

21. A method of installing a high temperature electrode rod in a high temperature electrode connection assembly, the high temperature electrode rod comprising a cup and a plate adapter portion with a circumferential groove, the method comprising:
mounting the cup of the high temperature electrode rod to a stud embedded in a wafer-processing pedestal;
positioning a floating plate to locate the high temperature electrode rod through an aperture of the floating plate, wherein the floating plate is configured to contact an inner surface of the wafer-processing pedestal to resist lateral movement of the electrode rod;
tightening the high temperature electrode rod to preload a washer between the cup and a shoulder of the stud in the wafer-processing pedestal;
frictionally engaging an anti-rotation retainer ring in the circumferential groove around the high temperature electrode rod;
partially releasing the preload on the washer by loosening the high temperature electrode rod by a predefined number of degrees; and
placing the anti-rotation retainer ring in contact with or in close proximity to an anti-rotation post affixed to the floating plate such that the anti-rotation post and anti-rotational retainer ring are together configured to limit rotation of the high temperature electrode rod with respect to the floating plate.

22. The method of claim 21, wherein frictionally engaging the anti-rotation retainer ring in the circumferential groove around the electrode rod comprises orienting a feature on the anti-rotation retainer ring to a first index mark on the floating plate.

23. The method of claim 21, wherein partially releasing the preload on the washer by loosening the electrode rod by the predefined number of degrees comprises rotating the electrode rod such that the anti-rotation retainer ring is in contact with, or in close proximity to, the anti-rotation post.

* * * * *